US011493908B2

(12) United States Patent
Yates et al.

(10) Patent No.: US 11,493,908 B2
(45) Date of Patent: Nov. 8, 2022

(54) INDUSTRIAL SAFETY MONITORING CONFIGURATION USING A DIGITAL TWIN

(71) Applicant: Rockwell Automation Technologies, Inc., Mayfield Heights, OH (US)

(72) Inventors: Chris John Yates, Corstorphine (GB); Maciej Stankiewicz, Dalkeith (GB); Jonathan Alexander, Dunblane (GB); Chris Softley, Midlothian (GB)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 842 days.

(21) Appl. No.: 16/189,116

(22) Filed: Nov. 13, 2018

(65) Prior Publication Data

US 2020/0150637 A1 May 14, 2020

(51) Int. Cl.
G05B 19/41 (2006.01)
G05B 19/418 (2006.01)
G05B 19/048 (2006.01)

(52) U.S. Cl.
CPC ..... *G05B 19/41885* (2013.01); *G05B 19/048* (2013.01); *G05B 19/4184* (2013.01)

(58) Field of Classification Search
CPC ............ G05B 19/41885; G05B 19/048; G05B 19/4184; G05B 19/41875;

(Continued)

(56) References Cited

U.S. PATENT DOCUMENTS

| 2009/0015663 A1* | 1/2009 | Doettling | H04N 13/02 348/46 |
| 2010/0321180 A1* | 12/2010 | Dempsey | G08B 1/08 |

(Continued)

FOREIGN PATENT DOCUMENTS

| DE | 2378445 A1 * | 10/2011 | ............. G06F 30/13 |
| EP | 2 378 445 A1 | 10/2011 | |
| EP | 3 318 945 A2 | 5/2018 | |

OTHER PUBLICATIONS

Extended European Search Report received for European Patent application No. 19208633.8, dated Apr. 20, 2020, 11 pages.

(Continued)

*Primary Examiner* — Tarun Sinha
*Assistant Examiner* — Lal C Mang
(74) *Attorney, Agent, or Firm* — Amin, Turocy & Watson, LLP

(57) ABSTRACT

An industrial safety zone configuration system leverages a digital twin of an industrial automation system to assist in configuring safety sensors for accurate monitoring of a desired detection zone. The system renders a graphical representation of the automation system based on the digital twin and allows a user to define a desired detection zone to be monitored as a three-dimensional volume within the virtual industrial environment. Users can define the locations and orientations of respective safety sensors as sensor objects that can be added to the graphical representation. Each sensor object has a set of object attributes representing configuration settings available on the corresponding physical sensor. The system can identify sensor configuration settings that will yield an estimated detection zone that closely conforms to the defined detection zone, and generate sensor configuration data based on these settings that can be used to configure the physical safety sensors.

21 Claims, 20 Drawing Sheets

(58) Field of Classification Search
CPC ........... G05B 2219/24008; G05B 2219/25067; G05B 2219/32252; G05B 23/0243; G06F 30/20

See application file for complete search history.

(56) References Cited

U.S. PATENT DOCUMENTS

| | | | |
|---|---|---|---|
| 2018/0131907 A1* | 5/2018 | Schmirler | H04N 7/181 |
| 2018/0222052 A1 | 8/2018 | Vu et al. | |
| 2018/0284758 A1* | 10/2018 | Celia | G05B 23/0297 |
| 2019/0378264 A1* | 12/2019 | Braune | |
| 2021/0110075 A1* | 4/2021 | Dalloro | G06F 30/12 |

OTHER PUBLICATIONS

Decision to grant a European patent pursuant to Article 97(1) EPC received for European Patent application No. 19208633.8 dated Dec. 2, 2021, 2 pages.

* cited by examiner

INDUSTRIAL SAFETY MONITORING CONFIGURATION USING A DIGITAL TWIN

BACKGROUND

The subject matter disclosed herein relates generally to industrial automation systems, and, more particularly, to configuration of industrial safety systems.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, an industrial safety zone configuration system is provided, comprising a user interface component configured to render a three-dimensional graphical representation of an industrial automation system based on a digital twin representing the industrial automation system, and receive, via interaction with the graphical representation, first input that defines a three-dimensional detection zone within the graphical representation, and receive, via interaction with the graphical representation, second input that adds one or more sensor objects to the graphical representation at specified locations and orientations to yield a modified digital twin, wherein the one or more sensor objects represent respective one or more safety sensors and have associated therewith respective sets of object properties representing configuration settings of the one or more safety sensors; a safety zone simulation component configured to estimate, based on analysis of the modified digital twin, an estimated detection zone monitored by the one or more sensor objects; a safety zone configuration component configured to, in response to determining that the estimated detection zone does not match the detection zone defined by the first input within a tolerance, set a value of at least one object property of the sets of object properties based on a comparison between the estimated detection zone and the detection zone; and a system interface component configured to generate sensor configuration data based on values of the sets of object properties and to configure the one or more safety sensors using the sensor configuration data.

Also, one or more embodiments provide a method for configuring safety sensors, comprising rendering, by a system comprising a processor, a three-dimensional graphical representation of an industrial automation system based on a digital twin representing the industrial automation system; defining, by the system, a three-dimensional detection zone within the graphical representation in accordance with first input received via interaction with the graphical representation; adding, by the system, one or more sensor objects representing respective one or more safety sensors to the graphical representation at specified locations and orientations in accordance with second input received via interaction with the graphical interface, wherein the one or more sensor objects have associated therewith respective sets of object properties representing configuration settings of the one or more safety sensors, and the adding yields a modified digital twin; determining, by the system based on analysis of the modified digital twin, an estimated detection zone monitored by the one or more sensor objects; in response to determining that the estimated detection zone does not satisfy a similarity criterion relative to the detection zone defined by the first input, modifying, by the system based on a comparison between the estimated detection zone and the detection zone defined by the first input, a value of at least one object property of the sets of object properties; generating, by the system, sensor configuration data based on values of the sets of object properties; and configuring, by the system, the one or more safety sensors using the sensor configuration data.

Also, according to one or more embodiments, a non-transitory computer-readable medium is provided having stored thereon instructions that, in response to execution, cause a system comprising a processor to perform operations, the operations comprising rendering a three-dimensional graphical representation of an industrial automation system based on a digital twin representing the industrial automation system; defining, based on first input received via interaction with the graphical representation, a three-dimensional detection zone within the graphical representation; adding, based on second input received via interaction with the graphical representation, one or more sensor objects representing respective one or more safety sensors to the graphical representation at specified locations and orientations, wherein the one or more sensor objects have associated therewith respective sets of object properties representing configuration settings of the one or more safety sensors, and the adding yields a modified digital twin; determining, based on analysis of the modified digital twin, an estimated detection zone monitored by the one or more sensor objects; in response to determining that the estimated detection zone deviates from the detection zone defined by the first input in excess of a tolerance, modifying, based on a measured degree of similarity between the estimated detection zone and the detection zone defined by the first input, a value of at least one object property of the sets of object properties to yield modified configuration setting values; generating sensor configuration data based on values of the sets of object properties; and configuring the one or more safety sensors using the sensor configuration data.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
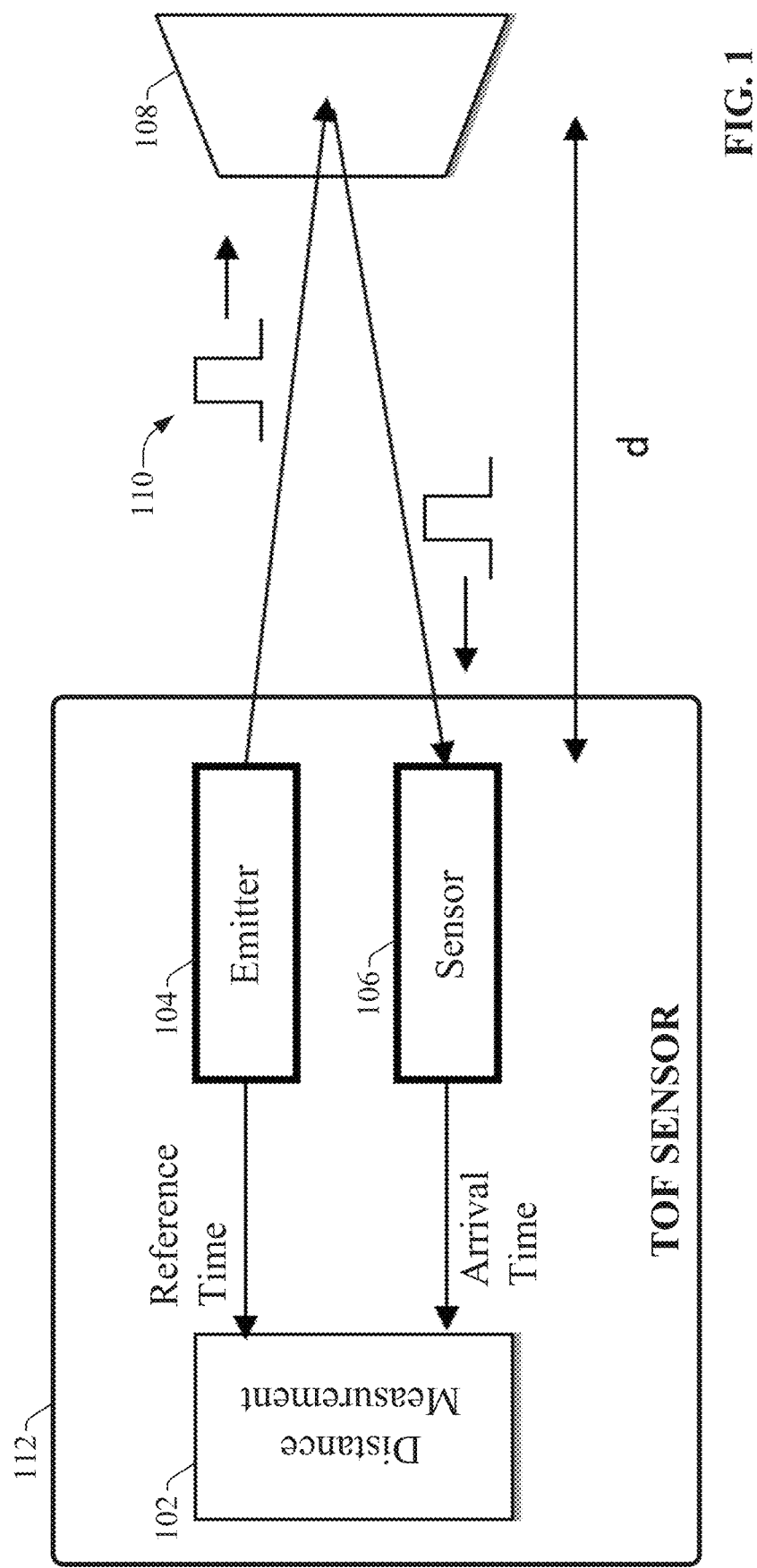
FIG. 1 is a generalized block diagram of a time-of-flight (TOF) sensor illustrating the principle of a typical time-of-flight measurement.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Many technologies exist for detecting distances of objects or surfaces within a monitored space. These include, but are not limited to, time-of-flight (TOF) optical sensors or other types of three-dimensional sensors—such as photo detectors or multi-pixel image sensors—which are used to detect distances of objects or surfaces within a viewing range of the sensor. An example optical sensor can include photo detectors that measure and generate a single distance data point for an object within range of the detector, as well as multi-pixel image sensors comprising an array of photo-detectors that are each capable of generating a distance data point for a corresponding image pixel. Some three-dimensional optical sensors, such as stereo vision technology or structured light technology measure distances using triangulation.

Some types of TOF sensors that employ pulsed light illumination operate by measuring the elapsed time between emission of a light pulse into the viewing field (or viewing space) and receipt of the subsequently reflected light pulse, from objects or surfaces within the viewing field, at the sensor's photo-receiver. This time-of-flight information is proportional to the distance to the object; thus, the sensor is able to determine the distance of the object or surface point from the sensor.

FIG. 1 is a generalized block diagram of a TOF sensor 112 illustrating the principle of a typical time-of-flight measurement. In general, the sensing technology used by some TOF sensors measures the time taken by a light pulse to travel from the sensor's illumination light source—represented by emitter 104—to an object 108 or surface within the viewing field and back to the sensor's light photo-detectors, represented by sensor 106. Sensor 106 can be, for example a dedicated multi-pixel CMOS (complementary metal oxide semiconductor) application-specific integrated circuit (ASIC) imager that integrates specialized means for measuring the position in time of received pulses. Distance measurement components 102 can measure the distance d to the object 108 as $$d = \frac{c \times t}{2} \quad (1)$$

where c is the speed of light, and t is the measured time of the round trip for the pulse from the emitter 104 to the object 108 and back to the sensor 106.

Emitter 104 of the TOF sensor 112 emits a short light pulse 110 into the viewing field. Objects and surfaces within the viewing field, such as object 108, reflect part of the pulse's energy back to the TOF sensor 112, and the reflected pulse is detected by respective pixels of sensor 106 (e.g., a photo-detector or a photo-sensor such as a photo-diode). Since the speed of light in vacuo c is a known constant and the time t elapsed between emission and reception of the pulse 110 can be measured or extracted, the distance measurement components 102 can determine, for each pixel of the sensor 106, the distance between the object 108 and the sensor by calculating half of the round-trip distance, as given by equation (1) above, or using another suitable calculation technique. Collectively, the distance information obtained for all pixels of the viewing space yields depth or range map for the viewing space. In some implementations, distance measurement components 102 can include a timer that measures the arrival time of the received pulse relative to the time at which emitter 104 emitted the pulse. In general, the TOF sensor 112 generates information that is representative of the position in time of the received pulse.

Some types of TOF sensors 112 project the pulsed light as a wide light beam toward an area to be monitored and analyze the reflected light received from surfaces and objects within the viewing area. Other types of sensors 112 may sweep a narrow or planar pulsed light beam across the viewing area in an oscillatory manner to collect and analyze line-wise image data. In other implementations, the sensor 112 may project a stationary, substantially planar beam of pulsed light across an area of interest and collect data on objects that pass through the beam.

Figure 2:
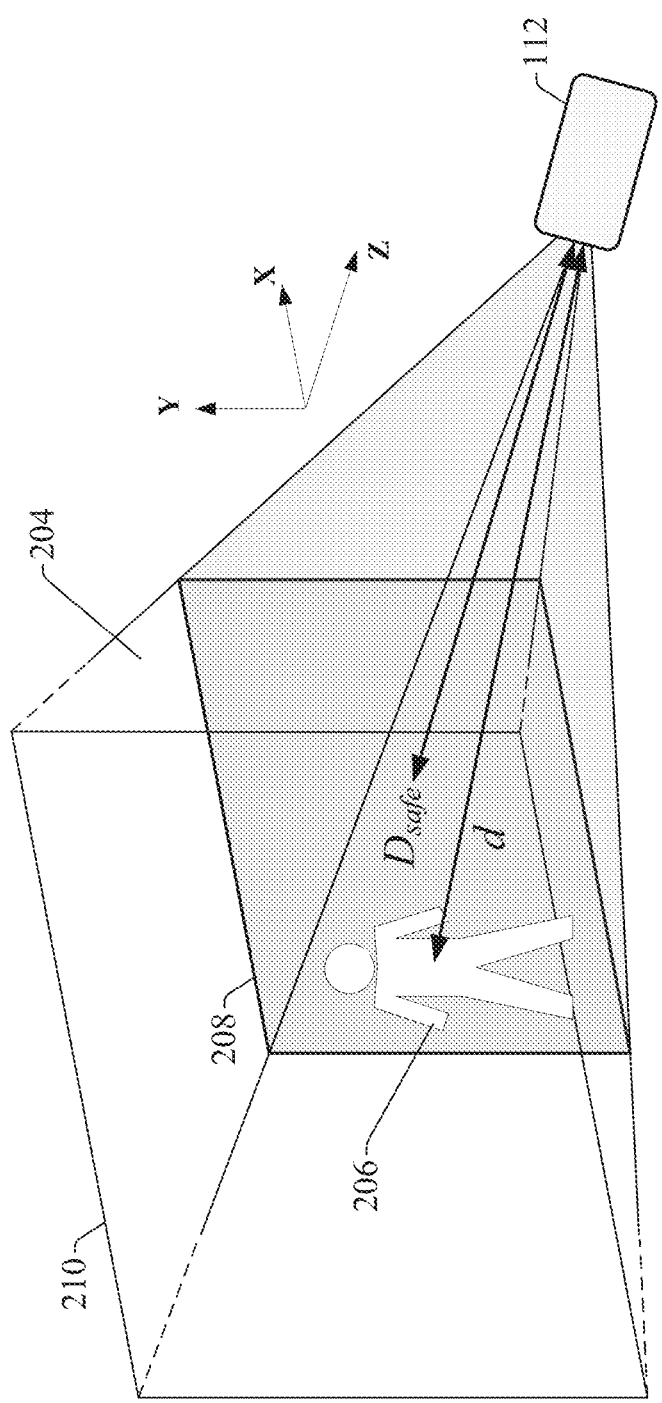
FIG. 2 is a schematic illustrating detection of a person within a monitored zone by a TOF sensor.

If a TOF sensor's distance calculation capabilities are sufficiently robust and reliable, the sensor can serve as an industrial safety device for an industrial safety system. FIG. 2 is a schematic illustrating detection of a person 206 within a monitored zone by a TOF sensor 112. In an example implementation, the TOF sensor 112 can be oriented and configured to monitor for intrusion of people 206 or objects (e.g., forklifts or other vehicles, moving machinery, etc.) within a defined protected zone, and to initiate a safety measure in response to detection of a person 206 or object within the protected zone. In the example depicted in FIG. 2, the sensor 112 (or an associated supervisory controller or safety relay) is configured to initiate the safety measure if a person 206 (or another prohibited object) is detected within a defined field of view (FOV) 210 (which may be less than a maximum field of view capable of being monitored by the sensor 112) at a perpendicular distance d (along the z-axis) from the sensor that is less than a defined safe distance $D_{safe}$ (along the z-axis). This yields a protected zone represented by the shaded volume illustrated in FIG. 2. Safety actions initiated by the sensor 112 in response to detection of a person 206 or object within this protected zone can include, for example, disconnection of power from a hazardous automated machine, placement of the machine in a safe operating mode (e.g., a slow operating mode), altering the trajectory of the machine to avoid the path of a detected person, or other such safety actions.

Although the boundary of the protected zone in the z-axis direction (along the projection axis of the sensor 112) is depicted as a plane 208 in FIG. 2, some TOF sensors 112 can allow the safe distance $D_{safe}$ to be defined individually for each pixel of the monitored scene, or for respective groups of pixels, yielding a boundary having a non-planar geometric shape.

Figure 3:
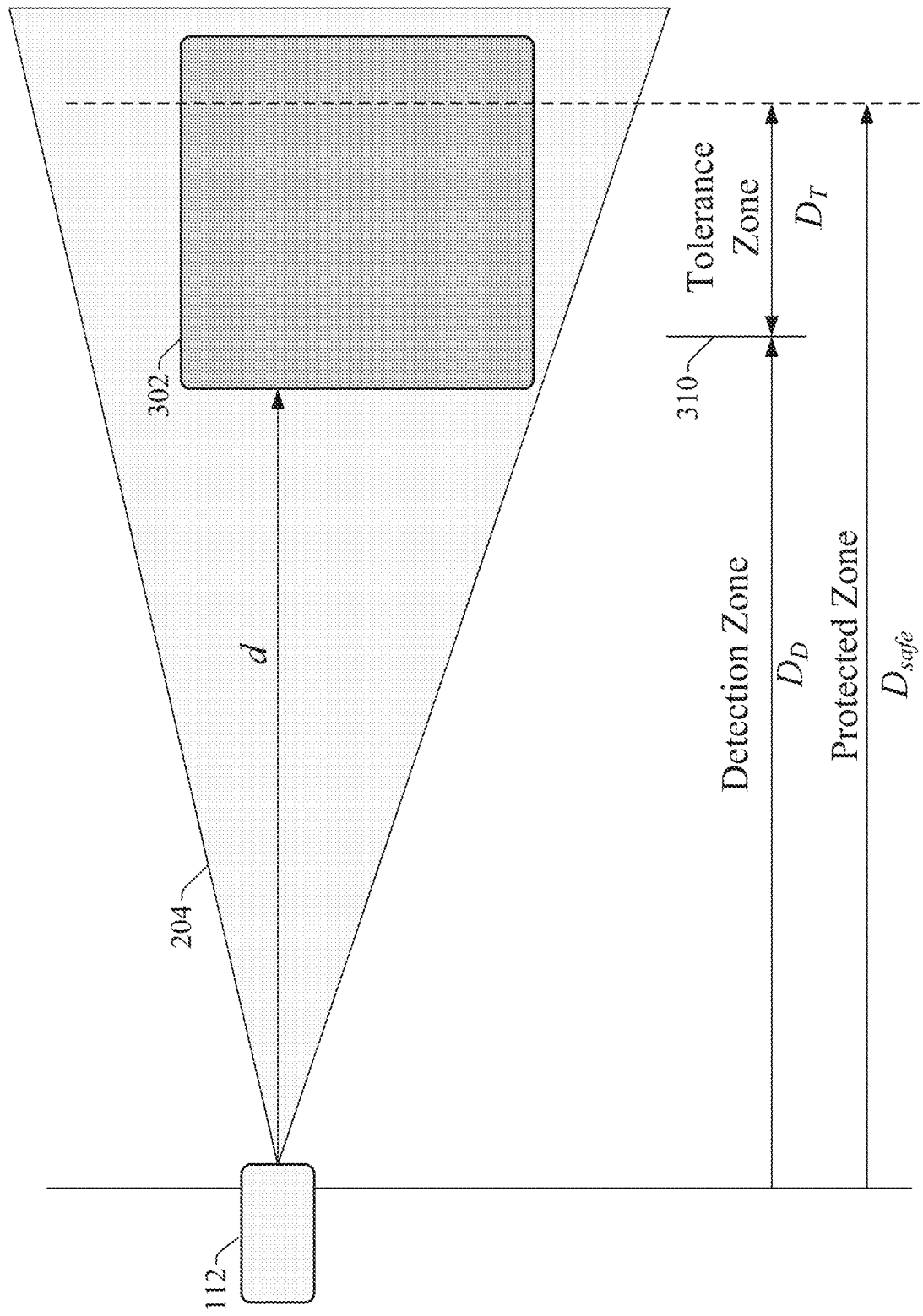
FIG. 3 is a diagram illustrating detection of an example cubical object by a TOF sensor.

FIG. 3 is a diagram illustrating detection of an example cubical object 302 by a TOF sensor 112. Sensor 112 performs intrusion detection by comparing a measured distance d of object 302 with the defined safe distance $D_{safe}$ representing the limit of the protected zone being monitored by the sensor 112. The safe distance $D_{safe}$ can be configured by a user based on the needs of the safety application within which TOF sensor 112 is being used. For example, safe distance $D_{safe}$ can be set to correspond to a determined minimum safe distance from a hazardous machine or area. When TOF sensor 112 determines that the distance d of object 302 is less than the safe distance $D_{safe}$ (that is, when $d<D_{safe}$), the object 302 is determined to be within the protected zone. In some applications, in response to detection of an object within the protected zone (that is, when the measured distance d is determined to be less than the distance $D_{safe}$ of the protected zone boundary), the sensor 112 or an associated controller (e.g., an industrial controller or safety relay) can initiate a defined safety action to place the protected area in a safe state (e.g., by disconnecting power to a hazardous machine, by placing the machine in a safe operating mode, etc.).

The distance $D_{safe}$ of the protected zone can be viewed as the sum of a detection zone distance $D_D$ and a tolerance zone distance $D_T$. With the detection criterion being defined as $d<D_{safe}$, a specific probability of detection must be guaranteed, in general to meet reliability requirements of a safety sensor, if the object 302 is at the boundary 310 of the detection zone—located at a distance $D_D$ from the TOF sensor 112.

Figure 4:
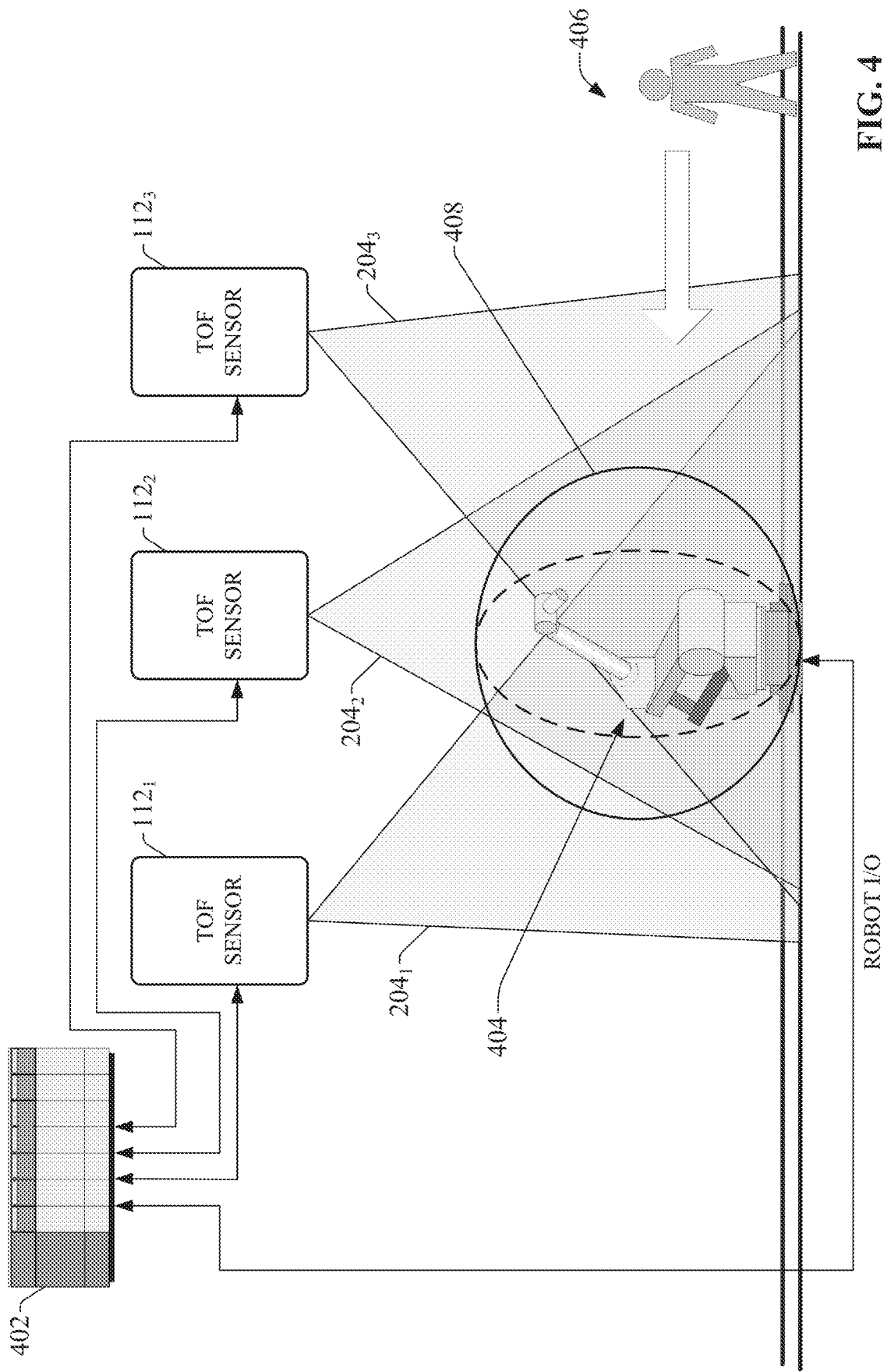
FIG. 4 is a diagram illustrating an example industrial safety monitoring architecture in which multiple TOF sensors are used to monitor a three-dimensional detection zone surrounding a hazardous industrial machine.

FIG. 4 is a diagram illustrating an example industrial safety monitoring architecture in which multiple TOF sensors 112 are used to monitor a three-dimensional detection zone 408 surrounding a hazardous industrial machine 404 (e.g., an industrial robot or other type of hazardous industrial equipment). In the illustrated example, three TOF sensors $112_1$-$112_3$ are mounted and oriented such that their emitted optical beams $204_1$-$204_3$ are directed toward the machine 404 to facilitate monitoring the defined detection zone 408 surrounding the machine 404. The detection zone 408 can be defined as a three-dimensional volume—either a geometric shape or more complicated three-dimensional mesh having irregular boundaries—surrounding the hazardous area around the machine 404.

TOF sensors 112 can be interfaced with an industrial safety relay 402, an industrial controller, or another type of supervisory safety controller as part of an overall industrial safety system. In response to detecting a person 406 or object within the defined detection zone 408, one or more of the TOF sensors 112 or the safety relay 402, which receives signals from the safety sensors 112, can generate a safety output that places the hazardous machine 404 in a safe state. For example, one or more of the TOF sensors 112 may send a signal to safety relay 402 indicating that a person 406 has been detected within the detection zone 408, causing the safety relay 402 to disconnect power from the machine 404. In another example safety action, one or more of the TOF sensors 112 may send an instruction to a controller of the machine 404 (e.g., an industrial controller or a robot controller) that changes an operating mode of the machine 404 to a safe mode (e.g., a slow operating mode) or that changes a trajectory of motion of the machine 404 to ensure that the machine's trajectory does not intersect with the trajectory of the person 406.

The range of possible three-dimensional shapes of the detection zone 408 is a function of the locations and orientations of the TOF sensors 112 as well as the sensors' configuration settings, which define the individual detection zone monitored by each sensor 112 in terms of the field of view, safe distance(s), tolerance zone, and other configurable monitoring parameters. In an example safety monitoring application, a designer may seek to implement an arrangement of TOF sensors 112 that adequately monitors a detection zone 408 having a desired shape. The number of TOF sensors 112 required to monitor a given detection zone may depend on the desired shape of the detection zone and the monitoring capabilities of the sensors 112.

Figure 5A:
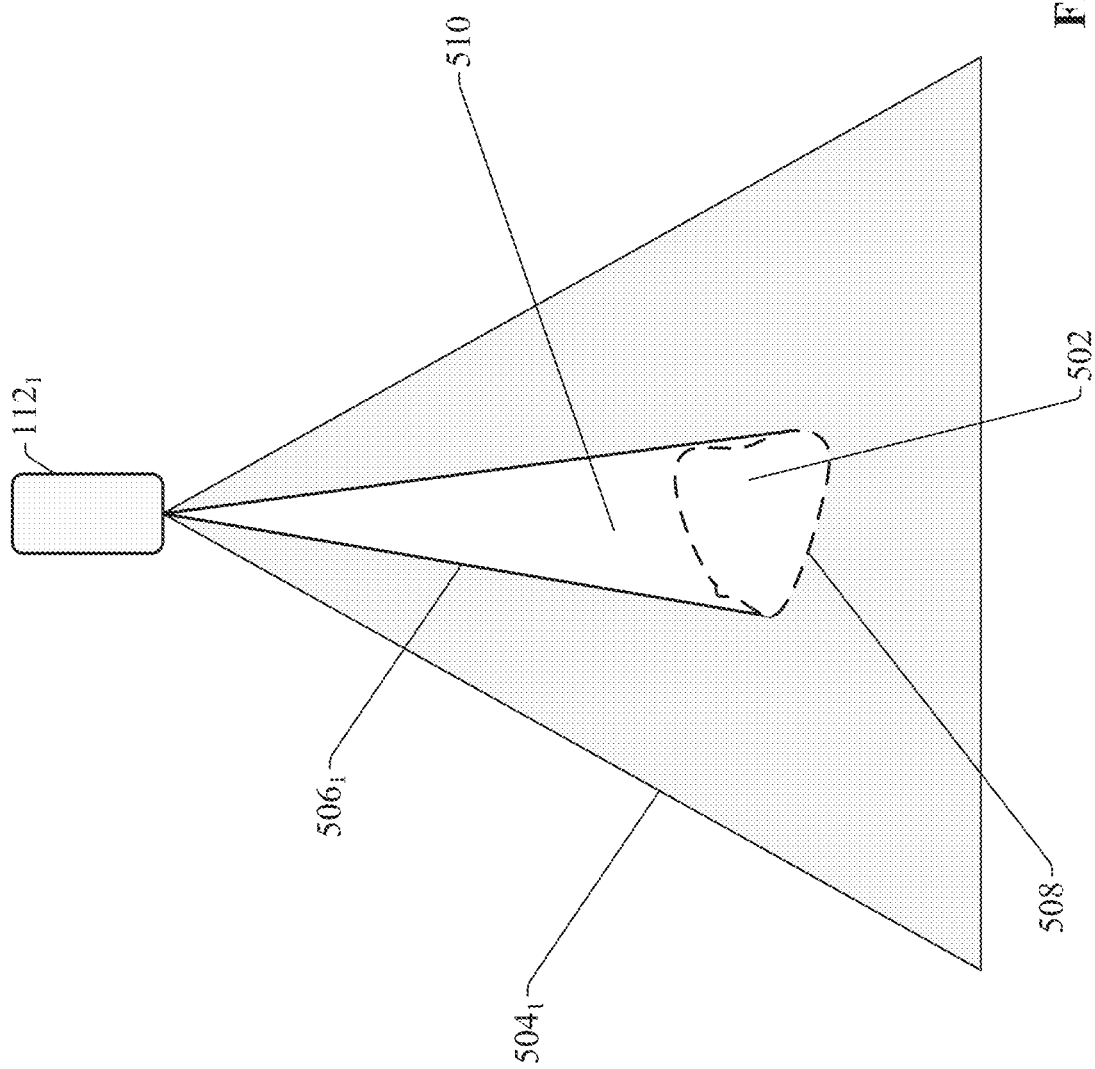
FIG. 5A is a diagram depicting monitoring of a detection zone by a single TOF sensor.
Figure 5B:
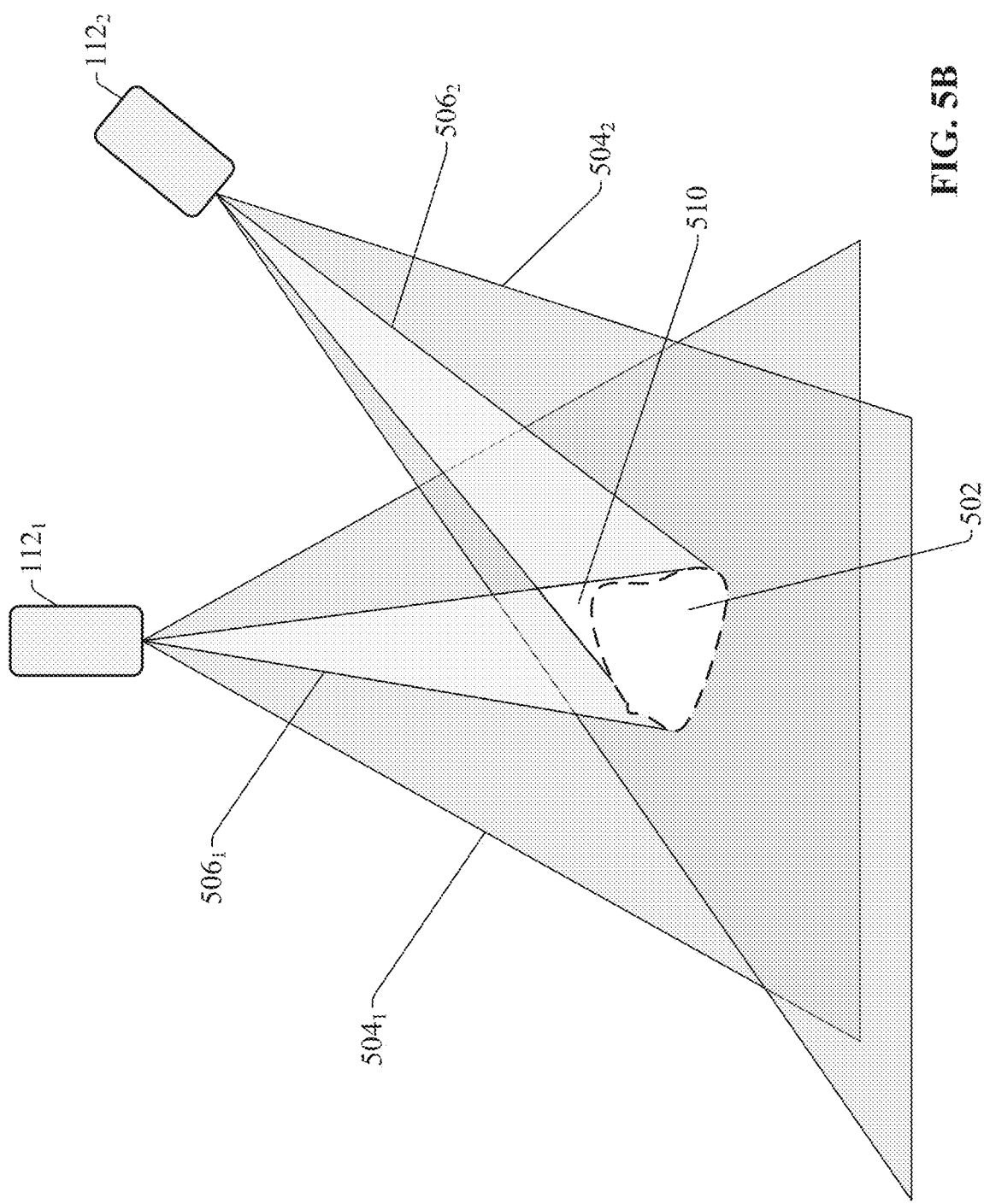
FIG. 5B is a diagram depicting monitoring of the detection zone by two TOF sensors.
Figure 5C:
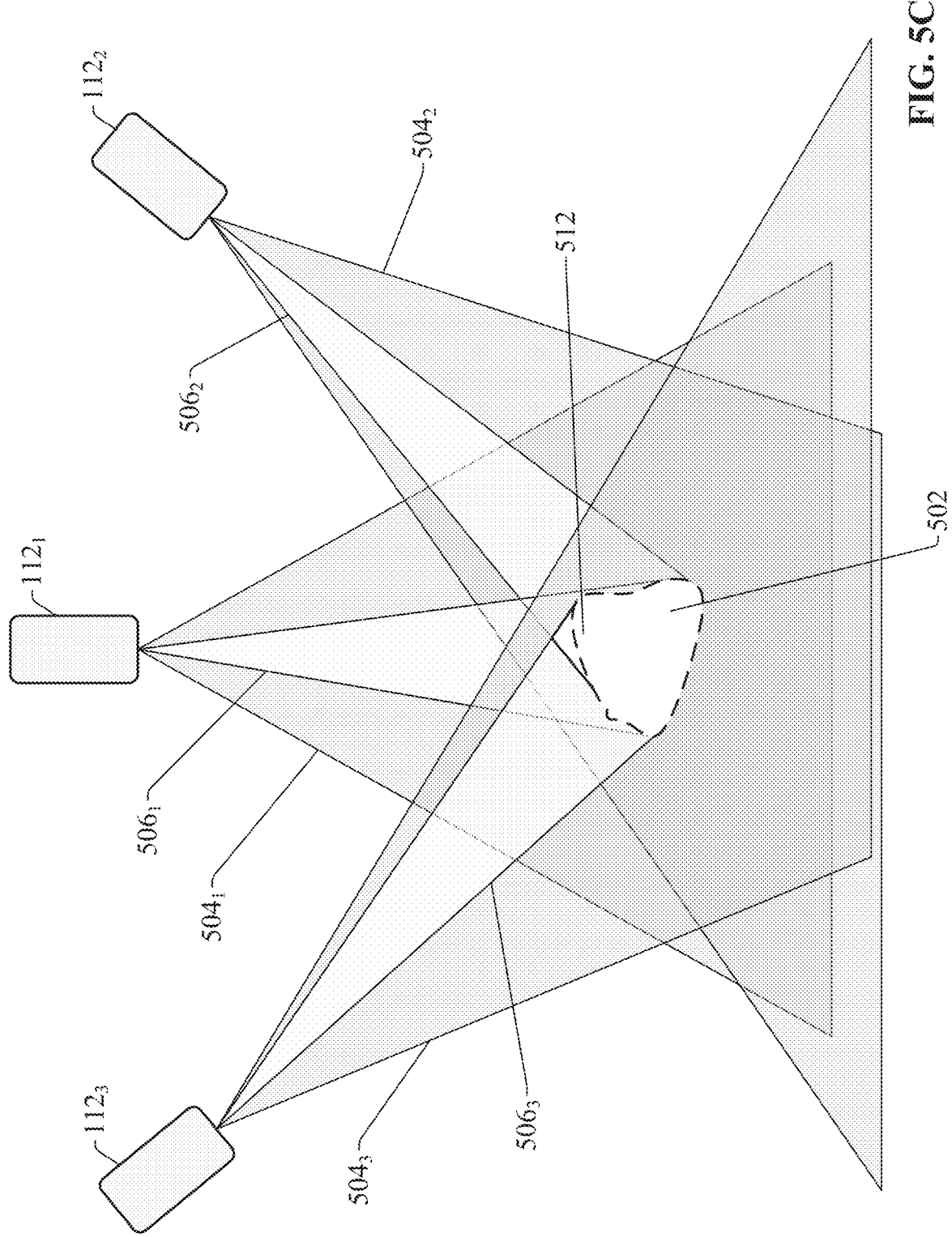
FIG. 5C is a diagram depicting monitoring of the detection zone by three TOF sensors.

FIGS. 5A-5C are diagrams illustrating how multiple TOF sensors 112 (or other types of optical or non-optical safety sensors) can yield a monitored detected zone that closely approximates a desired irregular shape or surface. In this example, TOF sensors 112 are to be mounted and oriented to monitor a desired detection zone 502 having an irregular shape represented by the dashed line. Although represented as a two-dimensional side view in FIGS. 5A-5C, the detection zone 502 will typically be a three-dimensional space or volume corresponding to a hazardous area to be monitored for intrusions.

FIG. 5A depicts monitoring of the detection zone 502 by a single TOF sensor $112_1$. TOF sensor $112_1$ is directed toward the desired detection zone 502 and is configured to monitor a field of view $506_1$ for intrusions (the configured field of view $506_1$ may be smaller than the maximum field of view $504_1$ capable of being monitored by the sensor $112_1$). The safe distance $D_{safe}$, representing the distance from the sensor $112_1$ within which intrusions will be flagged, can be configured individually for each pixel of the sensor's image to conform to the desired shape of the detection zone 502. However, since the configurable safe distance is a projection from the TOF sensor $112_1$ (as illustrated in FIG. 2), the boundary of the resulting detection zone can only conform to the far edge 508 of the desired detection zone 502. This yields an actual detection zone represented by the white region 510 within the total field of view 504, which is a larger volume than the desired detection zone volume.

As shown in FIG. 5B, addition of a second TOF sensor $112_2$ can bring the actual detection zone into closer alignment with the desired detection zone 502. The second TOF sensor $112_2$ can be directed toward the desired detection zone 502 from a different angle and configured to monitor a field of view $506_2$ (which may be less than the maximum field of view $504_2$ that can be monitored by the sensor $112_2$) that encompasses the desired detection zone 502 and that overlaps the field of view $506_1$ monitored by the first TOF sensor $112_1$. As with the first sensor $112_1$, the pixels of second sensor $112_2$ are configured to monitor corresponding safe distances $D_{safe}$ conforming the contours of the far side of the desired detection zone 502. Logic within the sensors 112 or within an associated safety relay or controller (e.g., safety relay 402) can specify that an intrusion is detected if a person or object is detected within the intersection of the two fields of view $506_1$ and $506_2$, resulting in an actual detection zone 510 represented by the white areas covered by both fields of view $506_1$ and $506_2$. As can be seen in FIG. 5B, this actual detection zone 510 more closely resembles the desired detection zone 502.

As shown in FIG. 5C, further refinement of the shape of the detection zone 502 can be achieved by adding a third TOF sensor $112_3$ that monitors a third field of view $506_3$ directed toward the desired detection zone 502 from yet another angle (where the third field of view $506_3$ may be smaller than the maximum field of view $504_3$ that can be monitored by the sensor $112_3$). Similar to the two-sensor scenario, logic in the sensors 112 or a corresponding safety relay or controller can be configured to initiate a safety action if a person or object is found within the actual detection zone 510 defined by the intersection of the three fields of view $506_1$, $506_2$, and $506_3$ (represented by the white areas in FIG. 5C). With the third sensor $112_3$ in place, the actual detection zone 510 is brought into closer conformity with the desired detection zone 502.

Correctly locating and configuring TOF sensors 112 to monitor a desired detection zone as part of an industrial safety solution can be complex, particularly if the shape of the desired detection zone is a complicated three-dimensional volume. Incorrect sensor placement or inaccurately configured FOVs may result in inadequate coverage of the desired detection zone, thus compromising safety. Moreover, an overly simplified sensor configuration that oversizes the detection zone can cause the safety system to initiate a large number of unnecessary safety actions (e.g., machine stops) or false alarms, resulting in excessive machine downtime and lost productivity.

To address these and other issues, one or more embodiments of the present disclosure provide an industrial safety zone configuration system that leverages a digital twin of an industrial automation system to assist users in configuring safety sensors for accurate monitoring of a desired detection zone. In one or more embodiments, a digital twin of an industrial automation system for which a safety monitoring system is to be designed can be imported into the safety configuration system, and the system can render a three-dimensional representation of the automation system based on the digital twin. The system allows the user to define a desired detection zone to be monitored as a three-dimensional volume within the graphical representation of the industrial environment. Virtual sensor objects representing safety sensors (e.g., TOF sensors) that are to monitor the defined detection zone can be added to the graphical representation at desired locations and orientations. Each sensor object has an associated set of object properties or attributes corresponding to adjustable configuration settings of the corresponding sensor (e.g., monitored field of view, detection zone distance, tolerance zone distance, frame rate, macropixel arrangement, etc.).

The configuration system can perform simulation analysis on the digital twin—including the sensor objects and their respective locations, orientations, and configuration settings—to estimate a detection zone that will be monitored by the actual safety sensors given the defined locations, orientations, and configurations. If the estimated detection zone does not sufficiently match the desired detection zone, the system can determine a suitable set of configuration settings for the respective sensor objects that will bring the estimated detection zone into conformity with the desired detection zone. The configuration system may also identify and recommend possible sensor realignments that would yield an estimated detection zone that more closely matches the desired detection zone. When a finalized set of configuration settings and sensor alignments have been identified, the system can generate sensor configuration data based on the identified configuration settings, which can be sent to the respective sensors (or an associated supervisory controller) to facilitate configuring the sensors in accordance with the selected settings.

Figure 6:
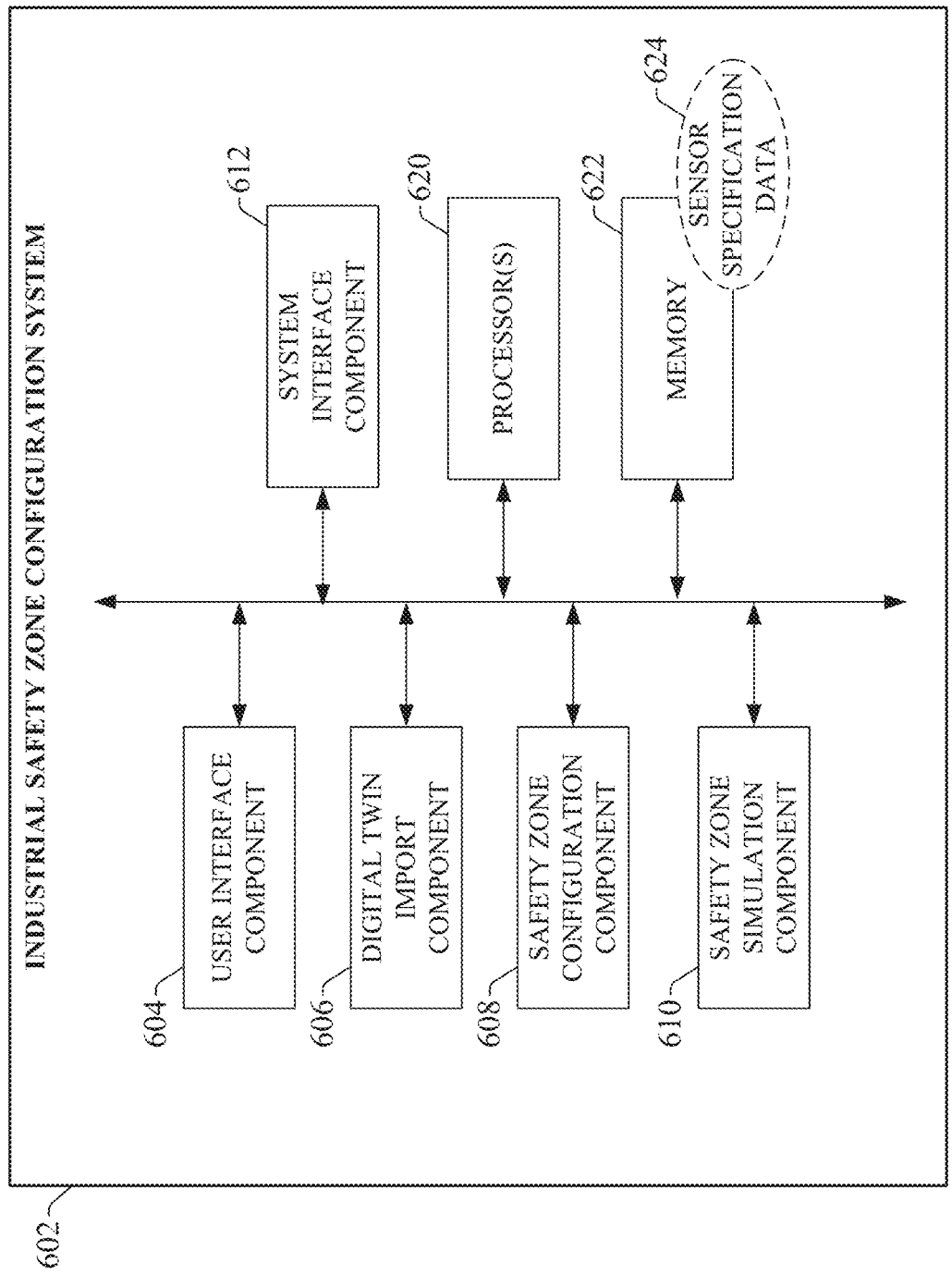
FIG. 6 is a block diagram of an example industrial safety zone configuration system.

FIG. 6 is a block diagram of an example industrial safety zone configuration system 602 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Industrial safety zone configuration system 602 can include a user interface component 604, a digital twin import component 606, a safety zone configuration component 608, a safety zone simulation component 610, a system interface component 612, one or more processors 620, and memory 622. In various embodiments, one or more of the user interface component 604, digital twin import component 606, safety zone configuration component 608, safety zone simulation component 610, system interface component 612, the one or more processors 620, and memory 622 can be electrically and/or communicatively coupled to one another to perform one or more of the functions of the safety zone configuration system 602. In some embodiments, components 604, 606, 608, 610, and 612 can comprise software instructions stored on memory 622 and executed by processor(s) 620. Safety zone configuration system 602 may also interact with other hardware and/or software components not depicted in FIG. 6. For example, processor(s) 620 may interact with one or more external user interface devices, such as a keyboard, a mouse, a display monitor, a touchscreen, or other such interface devices.

User interface component 604 can be configured to exchange data with a client device, such as a desktop, laptop, or tablet computer; a mobile device such as a smart phone; or other such client device. In various embodiments, user interface component 604 can generate and deliver graphical interface displays to the client device and receive input data via a user's interaction with the interface displays. The interface displays can include interactive graphical representations of an industrial system, where the graphical representations are generated based on digital twin information imported into the system 602.

Digital twin import component 606 can be configured to import a digital twin of an industrial automation system, or another type of digitized model of the automation system. Safety zone configuration component 608 can be configured to generate sensor configuration data based on sensor specification data 624 stored by the safety zone configuration system 602, as well as user input received via interaction with the graphical representation generated based on the digital twin. Safety zone configuration component 608 can also generate at least some of the sensor configuration data automatically based on simulation analysis performed on the digital twin and provisional sensor configuration data.

Safety zone simulation component 610 can be configured to perform the simulation analysis on the digital twin in view of sensor configuration data added to the digital twin as virtual sensor objects. Example analytics that can be performed by the safety zone simulation component 610 can include, but are not limited to, estimation of a detection zone covered by a specified sensor arrangement and configuration, estimation of a similarity metric indicating how closely the estimated detection zone matches a desired detection zone specified by the user, identification of possible modifications to the sensor arrangement or configurations that may bring the estimated detection zone into closer alignment with the desired detection zone, or other such analyses.

System interface component 612 can be configured to translate sensor configuration settings generated by the safety zone configuration component 608 into configuration instructions understandable by the safety sensors (or an associated safety relay or controller) and to send the configuration instructions to the relevant target devices to facilitate configuration of the devices in accordance with the configuration settings.

The one or more processors 620 can perform one or more of the functions described herein with reference to the systems and/or methods disclosed. Memory 622 can be a computer-readable storage medium storing computer-executable instructions and/or information for performing the functions described herein with reference to the systems and/or methods disclosed.

Figure 7:
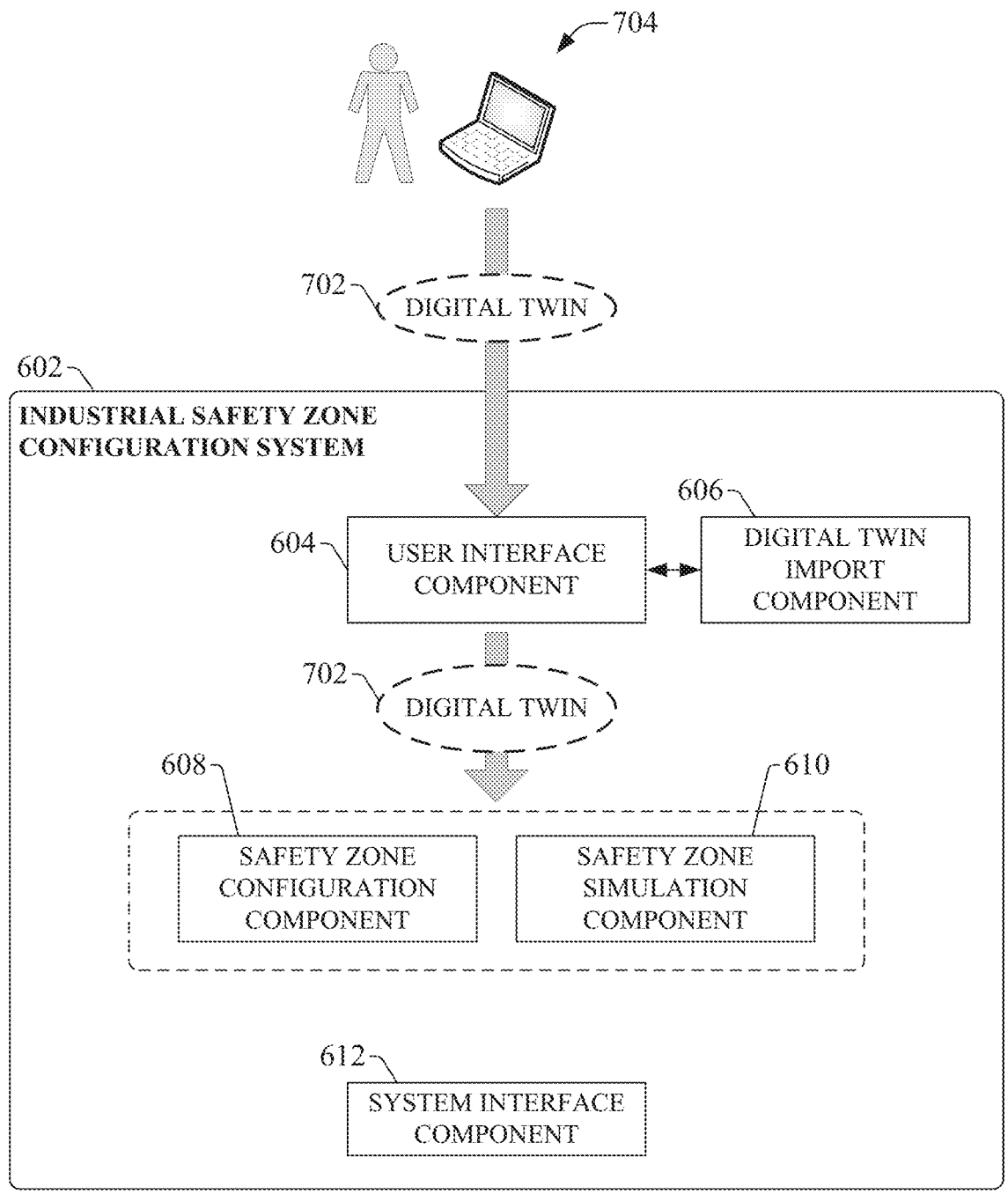
FIG. 7 is a diagram illustrating importation of a digital twin into a safety zone configuration system.

Embodiments of safety zone configuration system 602 can assist in the design and configuration of a safety monitoring system for an industrial automation system using a digitized representation—or digital twin—of the automation system. FIG. 7 is a diagram illustrating importation of a digital twin 702 into the safety zone configuration system 602. In the case of new automation system installations, or automation systems for which digital design information is available, digital twin 702 may be a digital model of the automation system (e.g., a computer-aided design, or CAD, model) that was previously generated by a separate industrial design platform during design of the automation system. The digital twin 702 can encode information about the construction of the automation system, and can also be visualized by a suitable visualization application (e.g., the original design platform in which the digital twin 702 was developed, or the safety zone configuration system 602) to render a three-dimensional virtual representation of the automation system.

Figure 8:
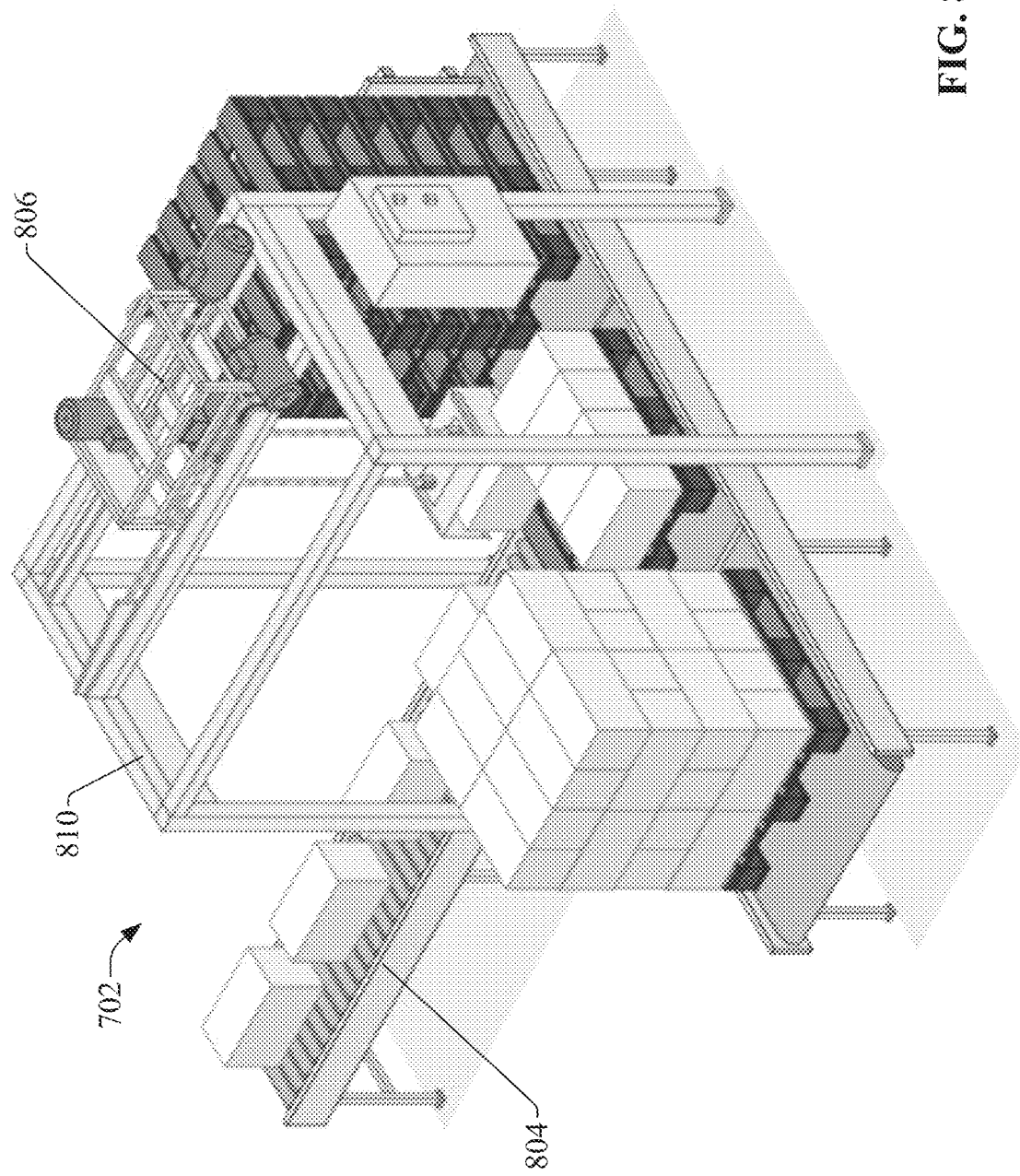
FIG. 8 is a graphical representation of a digital twin for an example automation system.

FIG. 8 is a graphical representation of a digital twin 702 for an example automation system (a palletizing cell in the illustrated example). The digital twin 702 can contain information identifying the equipment and devices that make up the automation system, including machinery (e.g., motor-driven machines 806, industrial robots, motion systems, etc.), conveyors 804, safety barriers, structural components (e.g., support frame 810), control devices such as industrial controllers or motor drives, safety input devices, and other aspects of the automation system. The digital twin 702 can also, in some embodiments, model the locations, orientations, and functionalities of the equipment and devices, as well as the relationships between the modeled components of the automation system. Thus, the digital twin 702 models both the physical appearance of the automation system as well as the operation and behaviors of the industrial assets that make up the automation system during operation (e.g., responses to control inputs in terms of movement, speed, temperatures, flows, fill levels, etc.), allowing the digital twin 702 to serve as a simulation environment for virtually testing operational aspects of the automation system prior to installation. In the case of existing automation systems for which no digital twin was developed, the automation system can be digitized using three-dimensional digitization scanning to yield a digital twin 702 of the automation system.

Returning now to FIG. 7, the digital twin import component 606 can import the digital twin 702 representing the automation system for which a safety system is to be designed and configured. To this end, user interface component 604 can generate and deliver suitable graphical interface displays to a client device 704 on which the digital twin 702 is stored, the interface displays including interactive features that allow a user to select the digital twin 702 to be imported (either from local storage on the client device 704 or from a networked location) and to initiate the import. When the digital twin 702 has been imported, safety zone configuration system 602 assigns a global coordinate system to the automation system model represented by the digital twin 702 so that accurate locational relationships between physical features of the modeled automation system and safety sensors subsequently added to the model can be tracked and recorded.

Once the digital twin 702 has been imported, the safety zone configuration system 602 can provide configuration tools that allow the user to design, via interaction with the digital twin 702, an arrangement and configuration of safety sensors for monitoring a desired detection zone. These configuration tools can allow the user to specify design parameters or explicit configuration settings for the safety monitoring system. Simulation tools can also perform simulation analysis on a specified safety system configuration and provide metrics or configuration recommendations based on results of the simulation, as will be described in more detail herein.

Figure 9:
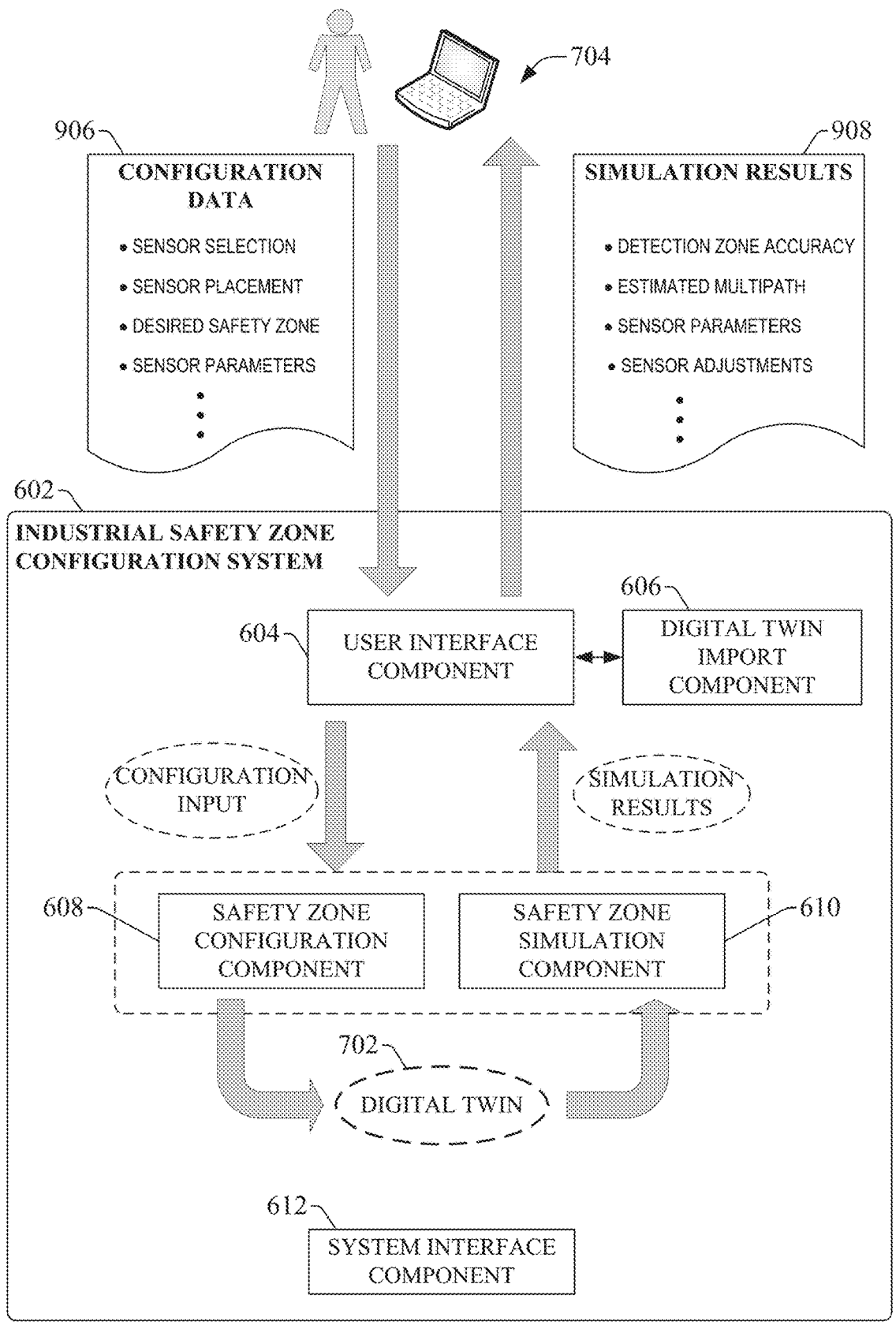
FIG. 9 is a diagram illustrating example data flows implemented by the safety zone configuration system during configuration of an industrial safety monitoring system.

FIG. 9 is a diagram illustrating example data flows implemented by the safety zone configuration system 602 during configuration of an industrial safety monitoring system. After the digital twin 702 has been imported, user interface component 604 can render a 3D virtual representation of the automation system represented by the digital twin 702 (similar to that depicted in FIG. 8) and allow the user to interact with the graphical representation to define desired detection zones, select safety sensors for inclusion in the safety system, specify locations and orientations for the selected safety sensors, select configuration parameter values for each sensor (e.g., field of views, tolerance zones, safety zones, frame-rates, macropixel layouts, etc.), or other such safety system design information. This information can be entered by the user as configuration data 906 via interaction with graphical interface displays rendered by the user interface component 604.

Also, as will be discussed in more detail below, safety zone simulation component 610 and safety zone configuration component 608 can perform iterative analysis on the digital twin 702 to identify optimal values of some sensor configuration settings or optimal orientations of the sensors that yield a detection zone that most closely aligns with a desired detection zone. Results of this simulation-based analysis can be rendered by the user interface component 604 as simulation results 908.

Figure 10:
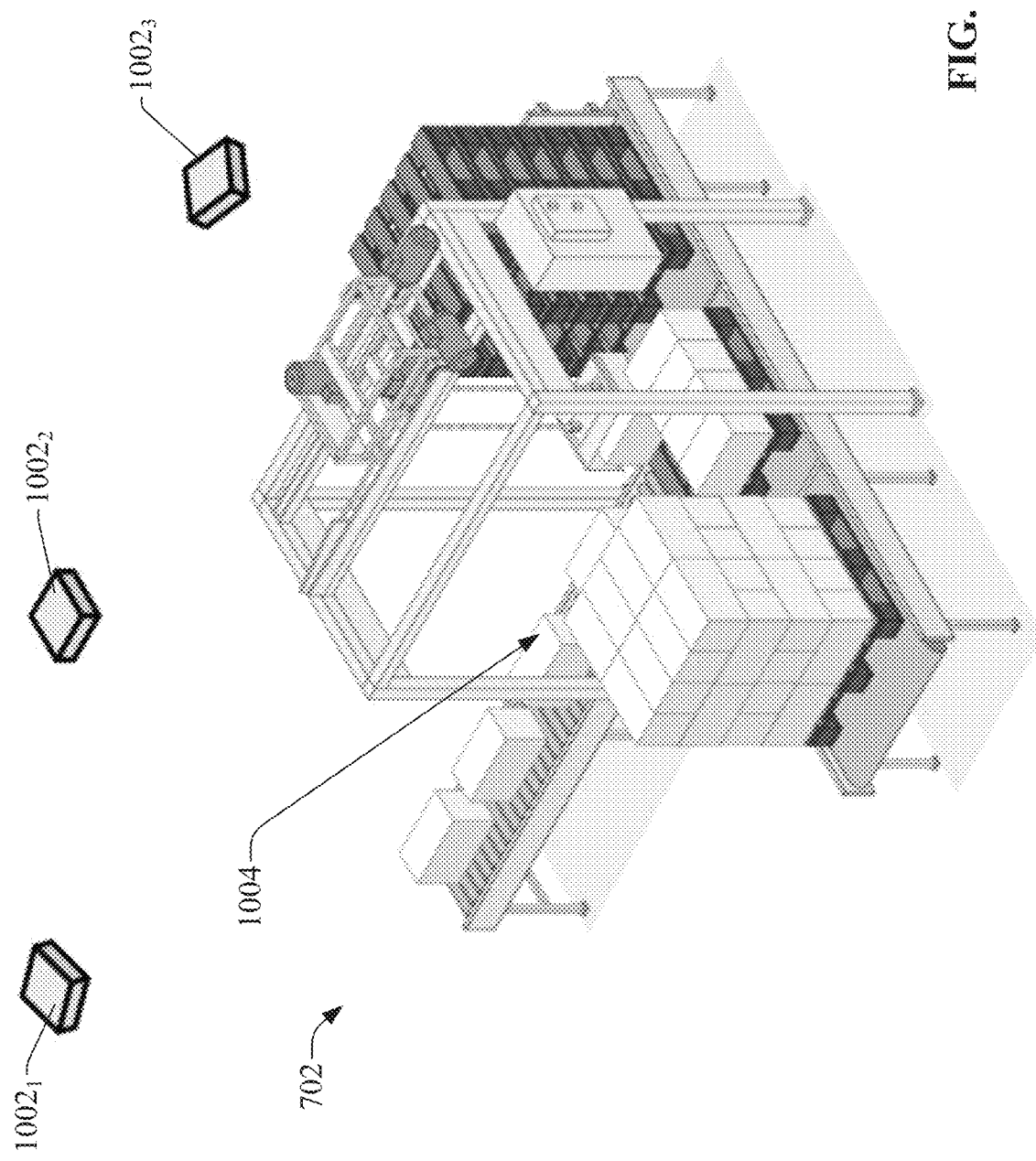
FIG. 10 is a graphical representation of a digital twin of an example automation system including graphical objects representing TOF sensors.

FIG. 10 is a graphical representation of the digital twin 702 for the example automation system, including graphical sensor objects 1002 representing safety sensors. In this example, a detection zone is to be defined around the pallet stacking area 1004 of the automation system. The safety zone configuration system 602 can allow the user to select safety sensors as virtual sensor objects 1002, and to place the sensor objects 1002 at selected locations within the graphical representation of the digital twin 702. In an example workflow, user interface component 604 may render a pull-down selection menu or another type of selection window listing available types of safety sensors. The list can include sensors of various models and sensing technologies provided by different vendors, and may include one or both of optical safety sensors (e.g., TOF sensors) and non-optical sensors (e.g., 3D radar sensors). User interface component 604 allows the user to select a safety sensor from the list and add a graphical sensor object 1002 representing the selected sensor to the digital twin 702.

In some embodiments, user interface component 604 can allow the user to select and drag the sensor objects 1002 within the visualization of the digital twin 702 to facilitate placement of the safety sensor at a desired location within the automation system model. Similar manipulations can be used to set the orientation (e.g., direction of the field of view) for the sensor object 1002. Alternatively, the user may manually enter a desired location for each sensor object 1002 as a set of coordinates within the digital twin's global coordinate system. When a sensor object 1002 is added to the digital twin 702, safety zone configuration component 608 can record the location of the sensor within the context of the digital twin's global coordinates.

Figure 11:
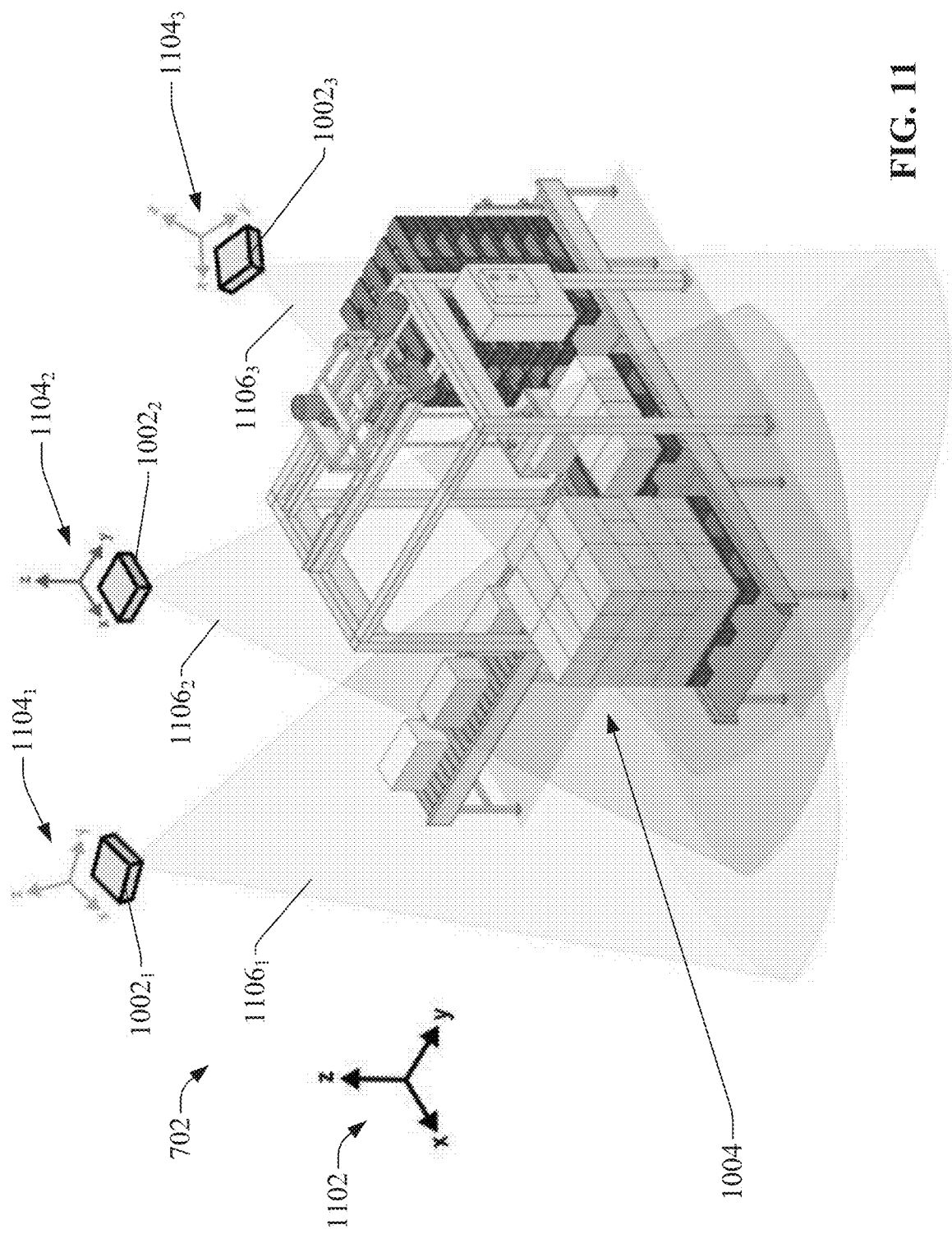
FIG. 11 is a view of a graphical representation of a digital twin illustrating independent local coordinate systems associated with each sensor object.

The defined orientation of each sensor object 1002 can be recorded as a set of local directional coordinates associated with the sensor object 1002. FIG. 11 is a view of the graphical representation of the digital twin 702 illustrating independent local coordinate systems associated with each sensor object 1002. As noted above, the digital twin 702 can record locations of objects within the modeled automation system environment according to a global coordinate space represented by axis 1102. Additionally, each sensor object $1002_1$-$1002_3$ can have an associated local coordinate system represented by axes $1002_1$-$1002_3$, which are oriented relative to the global coordinate system to match the orientations of the sensor objects $1002_1$-$1002_3$. In some embodiments, to assist the user in orienting the sensor objects 1002 toward a desired detection zone, user interface component 604 can generate FOV projections 1106 on the graphical representation of the automation system. These FOV projections 1106 represent the fields of view for the respective sensor objects 1002 and are depicted as emitted three-dimensional projections from each sensor object 1002. The directions of the FOV projections 1106 move as the user adjusts the orientations of the corresponding sensor objects 1002 in three-dimensional space, offering the user visual feedback that can assist with directional alignment.

Figure 12:
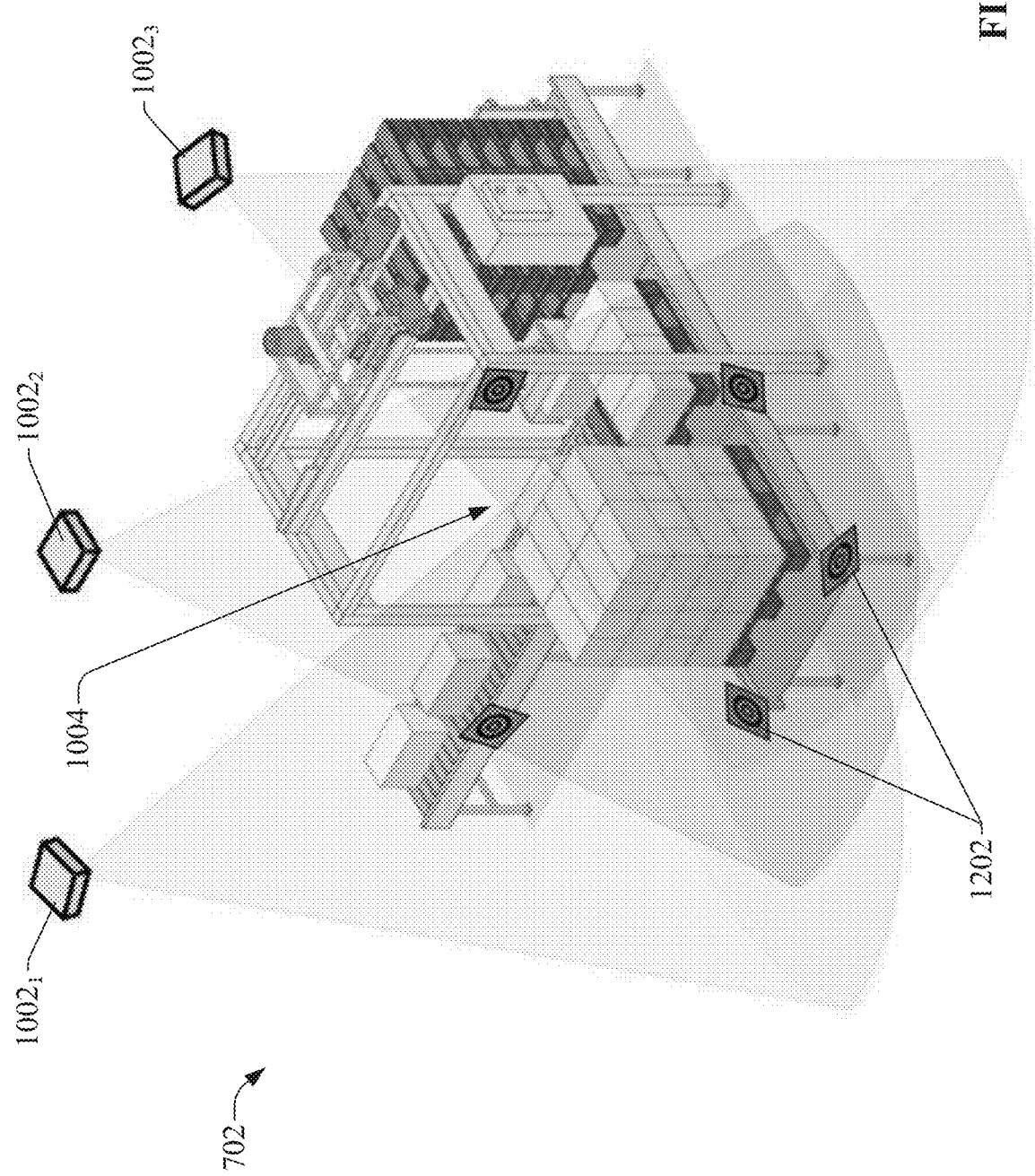
FIG. 12 is a view of a graphical representation of a digital twin that includes fiducial objects.

To assist with subsequent installation of the physical safety sensors 112 corresponding to sensor objects 1002, safety zone configuration system 602 can also allow fiducials to be added to the digital twin 702 as virtual objects. FIG. 12 is a view of the graphical representation of the digital twin 702 that includes fiducial objects 1202. Fiducials are reference markers that are placed at designated fixed locations on structures within a camera's field of view, and which are used by the camera to confirm its correct alignment (e.g., by confirming that the fiducials are located at the expected locations, or in the expected arrangements, within the camera's field of view). The virtual fiducial objects 1202 supported by the safety zone configuration system 602 represent physical fiducials or markers that will be installed at designated locations around the automation system environment and referenced by the safety sensors 112 (or a supervisory controller) to confirm that the actual alignments of the sensors 112 match their expected alignments (as defined by the sensor configuration data generated by the safety zone configuration component 608). In some embodiments, the locations of fiducial objects 1202 within the virtual environment of the digital twin 702 can be used by the configuration system 602 to extrapolate a transformation matrix for each sensor object 1002 that maps the sensor object's local coordinates (defined in terms of the sensor's local coordinate system) to the global frame of reference defined by the digital twin's global coordinate system.

In the example depicted in FIGS. 10-12, three sensor objects $1002_1$-$1002_3$ have been added to the digital twin 702, placed in selected locations relative to the automation system and oriented toward the area 1004 to be monitored using techniques described above. In an example design scenario, the designer may wish to determine an appropriate number of sensors 112, as well as optimal locations, orientations, and configurations of the sensors 112, that will accurately monitor a desired detection zone (in the present example, a detection zone surrounding pallet stacking area 1004). In some scenarios, one or more of these variables—number of sensors, sensor locations, sensor orientations, and sensor configurations—may be fixed due to design constraints associated with the automation system. For example, the mounting locations of a set number of sensors 112 may have already been decided upon previously during the design process. In such scenarios, the designer may place the sensor objects 1002 at their known fixed locations within the digital twin 702 (or, alternatively, the sensor objects 1002 may have been added a priori to the digital twin 702 prior to being imported into system 602), and use safety zone configuration system 602 to determine the other variables—e.g., sensor orientation and sensor configuration parameters, such as FOV, tolerance zone, frame rate, macropixel arrangement, etc.—that will yield accurate coverage of the desired detection zone. In other design scenarios, all sensor configuration variables—including mounting location—may be initially unresolved, and the safety zone configuration system 602 may determine a smallest number of sensors 112 that can accurately monitor the desired detection zone, as well as the locations, orientations, and configurations for these sensors 112.

Each sensor object 1002 has an associated set of object attributes or properties that are a function of the particular sensor model and/or vendor represented by the object 1002. These object attributes can include both fixed properties of the selected sensor as well as variable configuration properties associated with the sensor. Safety zone configuration component 608 can obtain default values of these object attributes from sensor specification data 624 corresponding to the selected sensor. Sensor specification data 624 identifies available configuration parameters and properties associated each model of sensor (which may be referenced by sensor serial number in some embodiments) that is available as a sensor object 1002, as well as factory default settings for one or more of these sensor parameters, which may be specific to an individual sensor. When a sensor object 1002 is added to the digital twin, the system safety zone configuration component 608 can reference this stored sensor specification data 624 and automatically populate the sensor object 1002 with default configuration parameter values (e.g., vendor- and model-specific factory settings) retrieved from the stored specification data 624.

After the sensor object 1002 has been added to the digital twin 702, user interface component 604 allows the user to invoke a display of the sensor object's attributes and properties in response to selection of the object 1002 (e.g., as a pop-up window overlaid on the digital twin visualization on or near the selected sensor object 1002). The user can then modify any of the user-adjustable sensor attributes, properties, or configuration parameters associated with the object 1002 via interaction with the displayed list of attributes. Example sensor configuration parameters that can be changed via interaction with the sensor object 1002 can include, but are not limited to, the FOV of the sensor (e.g., FOV 506 as shown in FIG. 5A), the safe distance from the sensor ($D_{safe}$) within which detection of a person or object will trigger a safety action, the tolerance zone for the sensor, a sensor frame-rate, a macropixel arrangement or layout, or other such parameters. Some sensor parameters, such as the safe distance $D_{safe}$, may be individually configurable for each pixel of the sensor's FOV, or for selected groups of pixels, so that the detection zone shape monitored by the sensor can conform to a defined contour or mesh shape (e.g., the irregular detection zone shape depicted in FIGS. 5A-5C).

In some embodiments, user interface component 604 can allow the user to define, within the digital twin 702, a desired or target detection zone to be monitored by the set of safety sensors. Safety zone configuration component 608 can then set one or more configuration parameters of each defined sensor object 1002 based on the defined detection zone. In such embodiments, user interface component 604 can allow the user to define the target detection zone as a three-dimensional volume within the automation system model having a regular or irregular shape. For example, user interface component 604 can allow the user to interact with a graphical representation of a three-dimensional detection zone shape to modify the shape as desired; e.g., by stretching or otherwise reshaping selected sides of the shape, by adding or removing sides to the shape, by manually entering dimensions for selected sides of the shape, or by other means. The user may also manually enter dimensions for the detection zone in some embodiments.

As an alternative to defining the shape of the detection zone within the safety zone configuration system 602, the detection zone shape can be defined by a separate application, such as a CAD platform (e.g., the same CAD platform used to generate the original digital twin 702), and imported into the configuration system 602. In such scenarios, the detection zone shape and location may be pre-defined as part of the digital twin 702 prior to importing the digital twin 702 into the configuration system 602. Alternatively, the detection zone shape can be defined as a separate file (e.g., a standard triangle language file or another file format) defining a 3D mesh shape, and this file can be imported into the system 602. In either case, user interface component 604 can allow the user to interact with the defined detection zone shape within the visualized automation system model to place the detection zone volume at a desired location within the digital twin 702.

In some embodiments, safety zone configuration component 608 can automatically set configuration parameter values for one or more of the sensor objects 1002 based on the shape and location of the defined detection zone to be monitored. For example, returning to FIG. 5C, a user may define a desired detection zone 512 surrounding a hazardous machine using techniques described above, and may add a set of sensor objects 1002 representing safety sensors $112_1$-$112_3$ to the digital twin 702 at designated locations within the automation system model, oriented so that the maximum available FOV 504 of each sensor 112 is directed toward the defined detection zone 512. With these design parameters in place, safety zone configuration component 608—working in conjunction with safety zone simulation component 610—can determine respective configurations for the three safety sensors $112_1$-$112_3$ that will yield accurate coverage for the desired detection zone 512. These configurations can be determined by the system 602 based on the shape of the detection zone 502 to be monitored and the locations and orientations of the safety sensors 112. Safety zone simulation component 610 can then set one or more configuration parameters of each of the sensor objects 1002 in accordance with the determined sensor configurations. Example sensor configuration settings that can be determined by the system 602 in this manner can include, but are not limited to, the FOV 506 to be monitored by each safety sensor 112, the safe distance $D_{safe}$ for each pixel of each camera's FOV 506 (which may be varied across the pixels of a given safety sensor 112 based on the defined contours of the detection zone 512), the tolerance zone for each safety sensor 112 (which may also vary across pixels), frame rate, macropixel arrangement, or other such safety sensor parameters.

Figure 13:
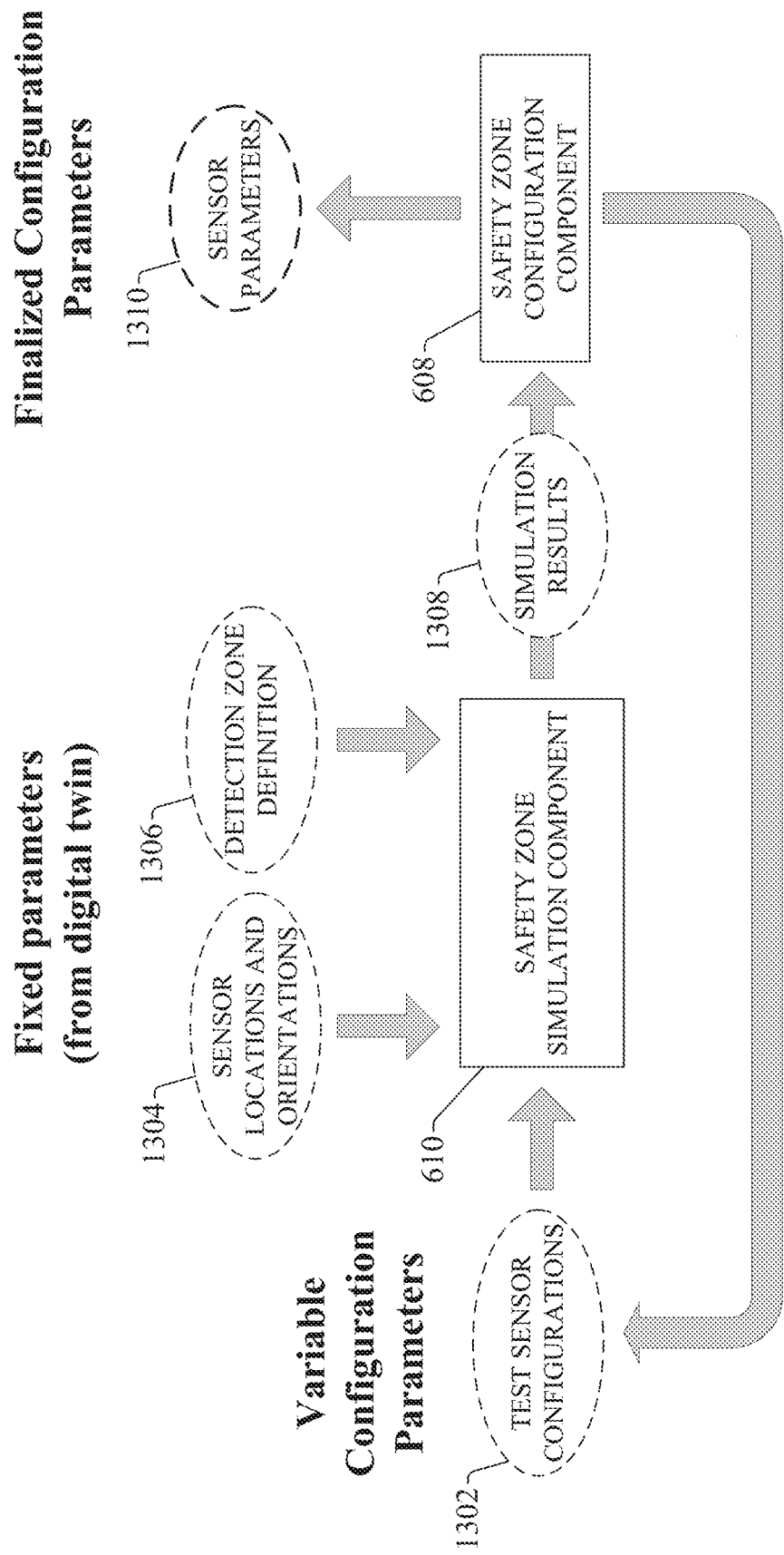
FIG. 13 is a diagram illustrating an example iterative simulation process that can be carried out by a safety zone simulation component and a safety zone configuration component to determine a suitable set of sensor parameters that, when implemented on a set of sensors having predefined locations, will accurately cover a defined detection zone.

To determine a substantially optimized set of sensor configurations capable of accurately monitoring the defined detection zone 512, safety zone simulation component 610 can be configured to simulate safety monitoring scenarios for a range of possible combinations of sensor configurations, and converge on a set of sensor configuration settings that will most accurately cover the defined detection zone. FIG. 13 is a diagram illustrating an example iterative simulation process that can be carried out by the safety zone simulation component 610 and the safety zone configuration component 608 to determine a set of sensor parameters 1310 that, when implemented on a set of sensors having pre-defined locations, will accurately cover a defined detection zone. In this illustrated scenario, the number of safety sensors that will be used in the safety monitoring system is fixed, as are the locations and orientations of these sensors. The sensor locations and orientations have been defined in the digital twin 702 by the designer using techniques described above (e.g., by predefining the locations and orientations in the digital twin 702 prior to importing the digital twin 702 into the safety zone configuration system 602, or by adding the sensor objects 1002 corresponding to each sensor to the digitized model of the automation system after the digital twin 702 has been imported). The desired detection zone to be monitored has also been defined in the digital twin 702, as described above.

With these fixed parameters in place, safety zone configuration system 602 can allow the user to initiate an automatic sensor configuration sequence, whereby the safety zone simulation component 610 performs iterative simulation analysis on a range of test sensor configuration settings 1302 generated by safety zone configuration component 608. For each iteration of the analysis, safety zone configuration component 608 provides a set of test configuration settings 1302 for the safety sensors (e.g., FOVs, tolerance zone distances, detection zone distances, etc.), and safety zone simulation component 610 simulates safety monitoring of the automation system for a scenario in which the test configuration settings 1302 are implemented on the set of virtual safety sensors having the specified locations and orientations. Safety zone configuration component 608 can generate the test configuration settings 1302 for each virtual safety sensor based in part on the vendor and model of the sensor, which may dictate the available configuration parameters and capabilities of the sensor (as determined by referencing the stored sensor specification data 624). The simulation estimates the location and shape of the detection zone that would be monitored by the safety sensors if the sensors were configured in accordance with the test configuration settings 1302. Safety zone simulation component 610 can estimate the detection zone based on the test sensor configuration settings 1302, the vendor and model of each sensor, the locations and orientations of the sensors (as defined by sensor location and orientation data 1304), and physical characteristics of the automation system environment as modeled by the digital twin 702 (e.g., locations of physical barriers or equipment).

When the detection zone has been estimated based on the current test configuration settings 1302, safety zone simulation component 610 compares the estimated detection zone with the defined detection zone (represented by detection zone definition data 1306) obtained from the digital twin 702 and generates simulation results 1308, including detection zone similarity metrics, based on the comparison. The similarity metrics measure a degree to which the estimated detection zone matches the defined detection zone, and can include an overall similarity ratio, identities of segments of the estimated detection zone that deviate from the desired detection zone, or other such metrics.

The simulation results 1308 are provided to the safety zone configuration component 608, which modifies one or more of the test sensor configuration settings 1302 based on the similarity metrics recorded in the simulation results 1308. In general, the safety zone configuration component 608 will modify the test sensor configuration settings 1302 in a manner expected to bring the estimated detection zone into closer alignment with the defined detection zone based on the degree and nature of the deviations reported by the simulation results 1308. This may include, for example, modifying the FOV on one or more of the safety sensors, changing the defined safe distance for one or more pixels of a safety sensor, or other such modifications. These modified test sensor configurations 1302 are then provided to the safety zone simulation component 610 for the next iteration of the simulation, and new simulation results 1308 are generated based on the new test settings.

This iterative simulation analysis repeats until the similarity metrics reported by the simulation results 1308 satisfy a defined criterion. The set of test configuration settings 1302 that are determined to satisfy the defined criterion are outputted by the safety zone configuration component 608 as the finalized set of sensor parameters 1310, which are to be used to configure the actual safety sensors. The defined criterion may be a criterion indicative of a sufficient degree of conformity or similarity between the estimated and defined detection zones (e.g., when a similarity ratio is sufficiently close to 1). In general, the iterative simulation analysis seeks to find a set of sensor parameters 1310 that optimizes or substantially optimizes the degree of similarity between the estimated detection zone and the defined detection zone. In some embodiments, the simulation analysis may emulate a curve-fitting approach, whereby detection zone similarity metrics are estimated for a range of incrementally modified test configuration settings, with the test configuration settings being modified across iterations such that the similarity metrics converge to a desired metric (e.g., when the ratio between the estimated and defined detection zones equal or are nearly equal to 1). At any stage of the iterative analysis, the user interface component 604 may concurrently render the estimated detection zone and the desired detection zone as respective semitransparent three-dimensional overlays on the graphical automation system model for comparison purposes.

Alternatively, if the safety zone simulation component 610 determines that the defined number, locations, and orientations of the safety sensors are incapable of covering the defined detection zone within the required tolerances, the iterative simulation may identify the set of test configuration settings 1302 that achieve the greatest degree of conformity between the estimated and desired detection zone, and output these settings as the finalized sensor parameters 1310, together with a notification that the defined arrangement of sensors cannot achieve the desired monitoring requirements. In this scenario, the user interface component 604 may render the estimated detection zone and the desired detection zone as respective semitransparent three-dimensional overlays on the graphical automation system as described above, allowing the user to judge whether the estimated best achievable detection zone is adequate for safety monitoring purposes.

In some embodiments, if the defined arrangement of safety sensors is determined to be incapable of yielding an estimated detection zone that satisfies the similarity criterion, safety zone simulation component 610 may also identify, based on further simulation, a possible modification to a safety sensor's location or orientation that would bring the estimated detection zone into closer alignment with the defined detection zone, and user interface component 604 can render a recommendation to relocate or realign the sensor in accordance with this identified modification. In response to receiving an indication that the user has accepted a recommended reorientation of a sensor, safety zone configuration component 608 can automatically modify the orientation properties of the corresponding sensor object 1002 in the digital twin 702.

This further simulation may also identify a possible location and orientation of an additional safety sensor that could be added to bring the estimated detection zone into closer alignment with the defined detection zone, and this recommendation can also be rendered via the user interface component 604. The recommended location of such additional safety sensors may be determined based in part on available mounting locations identified based on analysis of the digital twin 702.

Although the scenario illustrated in FIG. 13 assumes that the sensor locations and orientations are fixed (based on the locations and orientations of the sensor objects 1002 within the digital twin 702), the designer may choose to set one or both of the sensor locations or sensor orientations to also be variables of the iterative simulation, and instruct the safety zone simulation component 610 to identify optimal locations and/or orientations of the sensors—in addition to identifying optimal configurations settings—that are determined to provide optimal coverage for the defined detection zone. In such scenarios, the iterative process carried out by the safety zone simulation component 610 and the safety zone configuration component 608 can be carried out for a range of locations and orientations of sensors, as well as a range of configuration settings for the sensors, to determine an arrangement and configuration of sensors capable of accurately covering the defined detection zone. In some embodiments, the user may define one or more constraints on the iterative simulation to ensure that the resulting safety system design satisfies design requirements (e.g., a constraint to find the smallest number of sensors capable of monitoring a defined detection zone within a specified degree of similarity, a constraint on sensor mounting locations, etc.).

In some embodiments, safety zone simulation component 610 can also be configured to estimate the effects of multipath interference on each defined safety sensor based on the location and orientations of the sensor objects 1002 within the modeled industrial area, as well as on physical characteristics of the industrial area modeled in the digital twin 702. Multipath interference can occur when light emitted by a safety sensor is reflected back to a given pixel of the safety sensor's detector via multiple paths (e.g., as a result of light reflecting off multiple objects before arriving at the sensor's detector), potentially reducing the accuracy of that pixel's distance measurement and impacting the sensor's probability of detection. Based on results of multipath interference analysis, safety zone configuration system 602 can either generate recommendations for repositioning one or more of the safety sensors to reduce the level of multipath interference seen by the sensors, or implement a configuration modification to one or more of the sensors that mitigates the effect of the estimated multipath interference.

For example, safety zone simulation component 610 can be configured to perform ray-tracing analysis on the digital twin 702 to estimate paths taken by light received at each pixel of each sensor. This ray-tracing analysis can be based, for example, on each sensor's expected direction of light emission given the location and orientation of the sensor, as well as physical obstructions within the light's path as defined in the digital twin 702. Based on this ray-tracing analysis (or using another analytic technique), safety zone simulation component 610 can estimate the level of multipath interference seen by each pixel of each sensor, and determine whether this estimated level of multipath interference exceeds a define tolerance level.

For pixels having an estimated level of multipath interference that exceeds the defined tolerance, safety zone configuration component 608 and safety zone simulation component 610 can identify one or more possible countermeasures that may reduce the interference level within acceptable tolerances. The identified countermeasure may be based in part on the configuration capabilities of the sensor experiencing the excessive interference, as determined based on the vendor and model of the sensor. For example, if the sensor experiencing the excessive interference supports application of multipath correction algorithms to selected pixels, safety zone configuration component 608 can update the configuration settings associated with the sensor's corresponding sensor object 1002 to apply such correction algorithms to the pixels. These configuration setting modifications can include the level (defined as a percentage in some cases) at which such correction algorithms will be applied to the pixel, which is based on the estimated level of multipath interference that will be seen by the pixel.

As another type of multipath countermeasure, safety zone simulation component 608 may identify, based on simulation analysis performed on the digital twin 702, a possible realignment of the sensor that is estimated to reduce the level of multipath interference to an acceptable level. In such scenarios, user interface component 604 can render a recommendation identifying the sensor that is expected to experience excessive multipath interference and proposing the realignment of the sensor. In response to receiving input indicating the user's acceptance of the proposed realignment, safety zone configuration component 608 will modify the orientation and/or location coordinates for the sensor object 1002 corresponding to the sensor accordingly. Note that, if fiducial objects 1202 are included in the digital twin 702, modifying the orientation of a sensor object 1002 will also update the sensor object's expected view of the fiducial objects 1202, which will be reflected in the configuration data that will eventually be downloaded to the sensors (or their supervisory controller).

Figure 14:
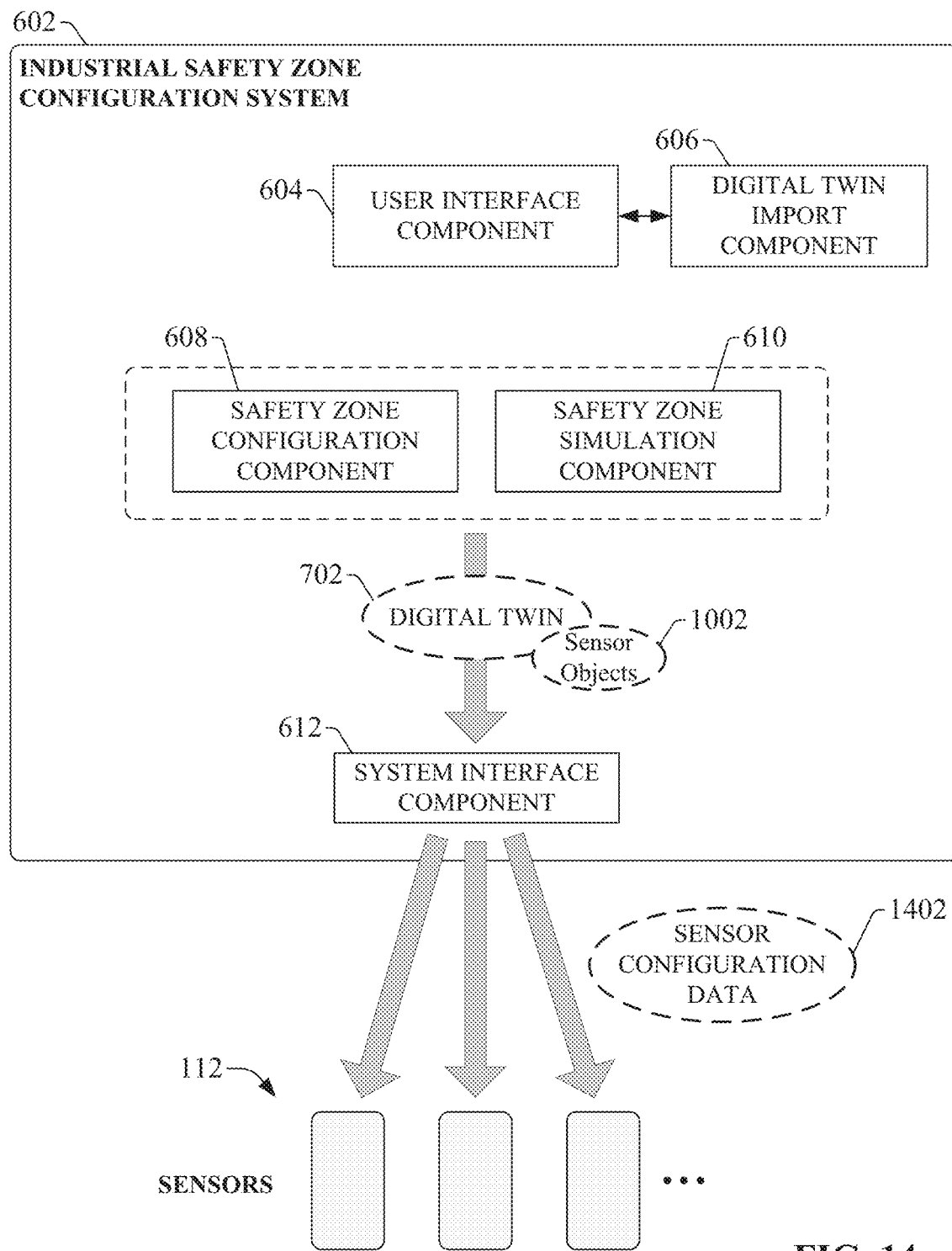
FIG. 14 is a diagram illustrating translation of a digital twin and associated sensor objects to sensor configuration data that can be used to configure TOF sensors.

FIG. 14 is a diagram illustrating translation of the digital twin 702 and associated sensor objects 1002 to sensor configuration data 1402 that can be used to configure the actual safety sensors 112. Once the digital twin 702 has been updated to include sensor objects 1002 for all safety sensors to be used in the safety solution, and the configuration settings (e.g., FOVs, safe distances, tolerance zones, etc.) for each sensor object 1002 have been finalized using techniques described above, system interface component 612 can translate the sensor configuration settings defined for the sensor objects 1002 to sensor configuration data 1402 that can be sent to the safety sensors 112 (or to a supervisory controller or safety relay that monitors and controls the sensors 112 and implements safety countermeasures) to facilitate configuring the sensors 112 for operation within the industrial safety application in accordance with the configuration settings. In some embodiments, system interface component 612 can format the sensor configuration data 1402 in accordance with a preferred vendor-specific or model-specific format of the target sensor 112 or controller, as determined by referencing sensor specification data 624. As noted above, sensor configuration parameters that can be set by sensor configuration data 1402 can include the FOV to be monitored by the sensor 112, the safe distances and tolerance zone distances associated with respective pixels of each sensor 112, a safety zone or safe stopping distance associated with the sensor 112, or other such parameters.

In some embodiments, if fiducial objects 1202 were added to the digital twin 702, sensor configuration data 1402 can also configure each sensor 112 with the expected locations or arrangement of fiducial markers as perceived within the sensor's field of view to assist with accurate alignment of the sensor in the field. To this end, safety zone configuration component 608 can determine the expected arrangement of fiducial markers seen by each sensor 112 based on the locations and orientations of the sensor objects 1002 relative to the locations of the fiducial objects 1202 within the digital twin 702. These expected fiducial marker locations can be encoded as part of sensor configuration data 1402 and sent to the sensors 112 by system interface component 612, which programs the sensors 112 to recognize the expected arrangement of fiducial markers previously determined by the safety zone configuration component 608. During or after installation of the safety sensors 112 in the field, each sensor 112 can compare the locations of fiducial markers within its FOV with the expected locations of these fiducial markers that were programmed by the system 602 to determine whether the sensor 112 is properly located and aligned to match the digital twin design. Depending on the sensor's capabilities, the sensor 112 may provide feedback to the user if the sensor's view of the fiducial markers does not match the expected view programmed by the configuration system 602.

System interface component 612 can be configured to deliver sensor configuration data 1402 to the respective sensors 112 (or to a supervisory controller or safety relay) over any suitable type of connection, including but not limited to a direct hardwired connection (e.g., a universal serial bus link, a serial cable link, etc.) or a wired or wireless network connection.

Although the examples described above assume a fixed detection zone, some safety applications may require a dynamic safety zone that changes location and/or shape based on the behavior of the hazardous industrial asset whose environment is being monitored. For example, the hazardous zone around an industrial robot may depend on the current operating mode of the robot (which may dictate the expected path of movement to which the robot will adhere). Accordingly, in some embodiments the safety zone configuration system 602 can allow the user to define the detection zone to be a dynamically changing detection zone, and the sensor configuration features described above can take the defined dynamic nature of the detection zone into consideration when determining suitable configurations settings, locations, and orientations for the sensors. In an example configuration scenario, the dynamic detection zone can be defined as having a fixed shape that follows a location of a specified hazardous industrial asset, or a location of a specified reference point on the industrial asset. The dynamic detection zone can also be defined by other algorithmic constraints in some embodiments, such as a defined envelope around a particular moving object or hazard. In another example, the user may define multiple different detection zone shapes and/or locations, and define respective operating conditions under which each detection zone will be in effect.

Some embodiments of configuration system 602 can support dynamic reconfiguration of the safety sensor's configuration settings, after the sensors have been placed in operation, based on real-time operational data received from the physical industrial assets or contextual data indicative of an environmental change within the monitored area. This dynamic re-configuration of safety sensors can maintain the accuracy of a desired static detection zone in light of changing environmental conditions, or dynamically alter the location and/or shape of a dynamic detection zone (defined as described above) in accordance with the current state of the monitored industrial assets.

In the case of static detection zones, some embodiments of configuration system 602 can collect relevant operational and status data from industrial assets associated with the monitored industrial area and update the digital twin 702 based on this data to accurately reflect the current state of the monitored area. This ensures that the digital twin 702 is synchronized with the physical automation system substantially in real-time. During operation of the automation system, safety zone simulation component 610 and safety zone configuration component 608 can perform simulation analysis on the updated digital twin 702 (based on the current sensor configuration settings) and determine, based on results of the analysis, whether the estimated detection zone is still substantially in alignment with the desired detection zone. If the estimated safety zone is determined to deviate from the desired detection zone in excess of a defined tolerance, safety zone configuration component 608 can update one or more values of the sensor object setting to bring the estimated detection zone back into substantial alignment with the predefined desired safety zone. System interface component 702 can then translate these updated settings to new sensor configuration data 1402, which is deployed to the sensors or their associated supervisory controller.

Some embodiments can also employ this general technique to dynamically update sensor configuration settings to mitigate unexpected increases in estimated multipath interference due to a change in atmospheric or environmental conditions within the monitored space. In such embodiments, analysis of the synchronized digital twin 702 may indicate that, due to changes in the environment being monitored by the safety sensors, the estimated level of multipath interference seen by one or more of the sensors has exceeded an acceptable threshold. In response to this determination, safety zone configuration system 608 can update the multipath correction algorithms being applied to the sensors to mitigate the effects of this elevated level of multipath interference.

In the case of dynamic detection zones having locations and/or shapes that depend on the context of the monitored area or other criteria, configuration system 602 can be configured to monitor, during operation of the automation system, the relevant data sources that dictate what the current location or shape of the detection zone should be per predefined criteria. This monitored data can include, for example, a current status of an industrial asset (e.g., as determined based on data read from a robot controller, a PLC, a telemetry device, a motor drive, or other such sources), a system master clock (e.g., for scenarios in which the shape or location of the detection zone depends on which stage of a process is currently running, as determined by the master clock), or other such information. In response to determining, based on the monitored information, that the detection zone should be relocated or re-shaped, safety zone configuration component 608 can update one or more of the sensor object parameters in a manner estimated to yield the target detection zone shape or location. System interface component 612 can then send these updated parameter values to the appropriate devices (sensor 112 or an associated supervisory controller) as updated sensor configuration data 1402.

In some embodiments, configuration system 602 can generate, for each safety sensor, a set of different configuration files corresponding to respective different detection zones, each detection zone corresponding to a different contextual scenario (e.g., a different stage of an industrial process, a different operating mode of an industrial robot, etc.). Configuration system 602 can then send configuration files from this set to the appropriate sensor in a defined sequence synchronously with the plant floor operation, based on the monitored status or contextual data as described above. In some such embodiments, these configuration files can be parameterized to reduce the sizes of the configuration files (e.g., by parameterization of the dynamically changing surface of the detection zone, which may be described by a mathematical equation).

By leveraging modeling data from a digital twin of an industrial automation system, embodiments of the industrial safety zone configuration system described herein can introduce a greater degree of automation to the process of designing and configuring a safety monitoring system catered to the design specifics of the automation system. The system allows the user to add, locate, orient, and configure safety sensor objects within a digital model of the industrial environment using an intuitive graphical interface, and includes simulation tools that generate configuration recommendations intended to bring the finalized safety system into close conformity with the user-specified detection zone requirements of the automation system being protected.

In some implementations, industrial safety zone configuration system 602 can be a stand-alone platform that imports digital twins from separate computer-assisted design platforms and exports the resulting sensor configuration settings to the sensors, to an associated industrial controller, or to another programming platform. In other implementations, industrial safety zone configuration system 602 can be an integrated subsystem of another design and/or programming platform, such as a CAD design platform (e.g., the same platform within which the digital twin is initially developed) or an industrial controller programming platform. In the latter scenario, configuration settings generated by the configuration system 602 that are directed to an industrial controller can be imported directly into an industrial control program being developed in parallel within the controller programming platform.

Figure 15A:
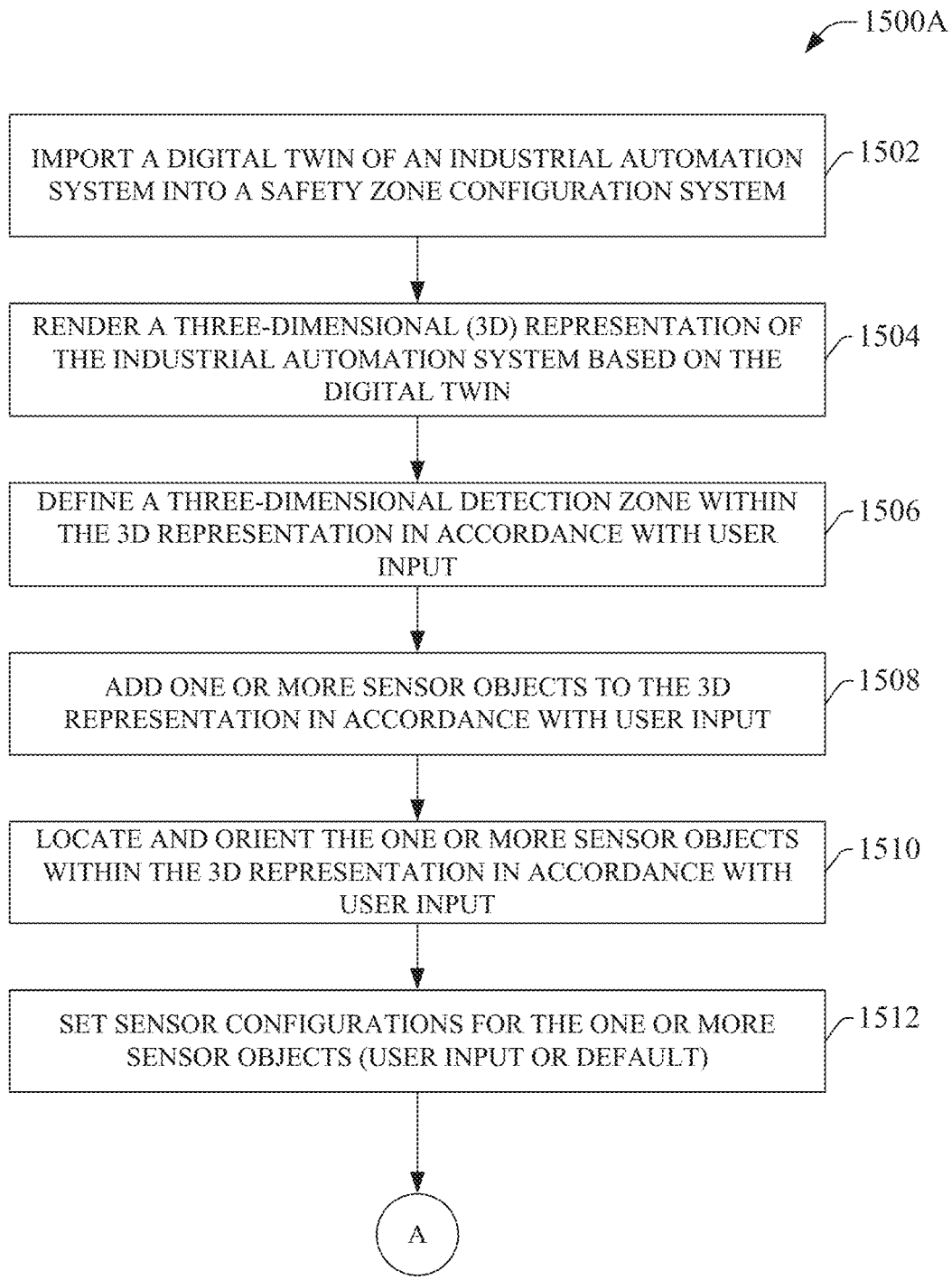
FIG. 15A is a flowchart of a first part of an example methodology for generating configuration settings for TOF safety sensors for use in an industrial safety monitoring application.
Figure 15B:
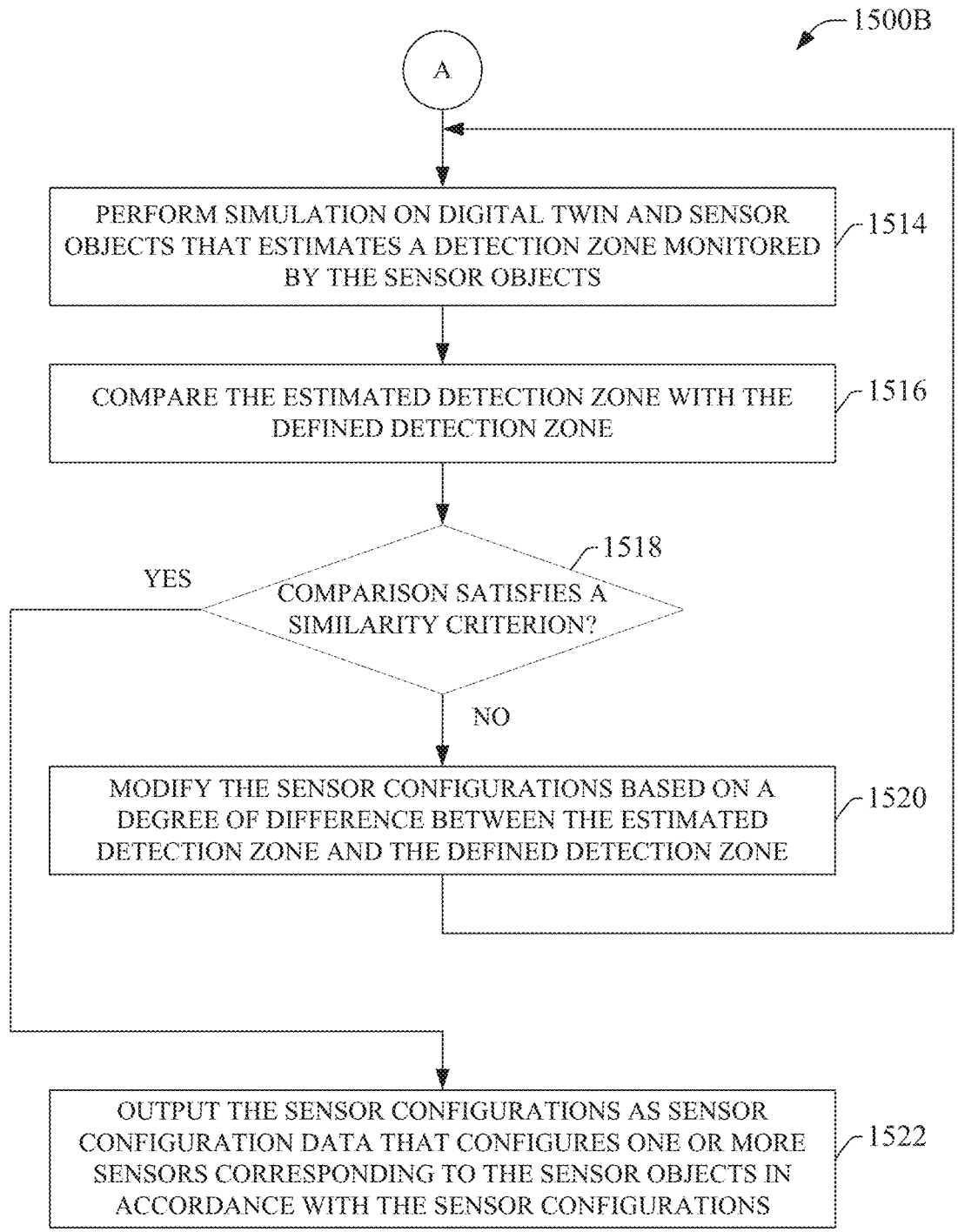
FIG. 15B is a flowchart of a second part of the example methodology for generating configuration settings for TOF safety sensors for use in an industrial safety monitoring application.

FIGS. 15A-15B illustrate a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 15A is a first part of an example methodology 1500A for generating configuration settings for safety sensors for use in an industrial safety monitoring application. Initially, at 1502, a digital twin of an industrial automation system is imported into a safety zone configuration system. The digital twin can be a digitized 3D virtual representation of an industrial automation system or environment for which a safety system is to be designed and configured. In some embodiments, the digital twin can be a CAD model of the automation system that models machinery, control and telemetry devices, safety barriers or other physical obstructions, conveyors, or other aspects of the automation system. At 1504, a 3D representation of the automation system is rendered based on information contained in the digital twin.

At 1506, a three-dimensional detection zone is defined within the 3D representation of the automation system in accordance with user input. The detection zone can be defined as a regular or irregular 3D volume within the virtual automation system. In some embodiments, the detection zone can be defined within the safety zone configuration system in accordance with a user's interactions with the rendered 3D representation of the automation system environment. Alternatively, the 3D shape of the detection zone can be imported into the safety zone configuration system as a file defining a 3D mesh shape. The defined detection zone represents a desired or target detection zone to be monitored within the industrial environment represented by the digital twin.

At 1508, one or more sensor objects are added to the 3D representation in accordance with user input. In an example implementation, the sensor objects can be added by selecting the objects from a rendered list of available vendor-specific sensors of various models. Each sensor object has an associated set of object properties or attributes corresponding to sensor configuration settings that can be set on the corresponding physical safety sensor. The set of available object properties for a given sensor object can depend on the vendor and model of the selected sensor object, and can be determined by the safety zone configuration system by referencing stored sensor specification data containing specification information for respective models of safety sensors.

At 1510 the one or more sensor objects are located and oriented within the 3D representation in accordance with user input. In an example scenario, each sensor object can be located and oriented within the virtualized automation system environment to correspond to an actual or anticipated mounting location and orientation of a corresponding physical safety sensor.

At 1512, sensor configuration settings for the one or more sensor objects are set. Initially, the sensor configurations for a given sensor object may be default sensor configurations determined based on the vendor and model of safety sensor represented by the sensor objects. However, a user may modify one or more of these default sensor configuration settings at step 1512 by changing the appropriate sensor object property or attribute. The sensor configuration settings can include, but are not limited to, fields of view to be monitored, detection zone distances and tolerance zone distances (which may be set on an individual pixel basis for a given sensor object), safety zone distances, or other such settings.

The methodology continues with the second part 1500B illustrated in FIG. 15B. At 1514, a simulation is performed on the digital twin and the sensor objects that estimates a detection zone that will be monitored by the sensor objects given the locations and orientations set at step 1510 and the sensor configuration settings set at step 1512. At 1516, the estimated detection zone obtained at step 1514 is compared with the defined detection zone obtained at step 1506. At 1518, a determination is made as to whether the comparison performed at step 1516 satisfies a similarity criterion indicative of an acceptable degree of similarity between the estimated and defined detection zones.

If the comparison does not satisfy the similarity criterion (NO at step 1518), the methodology proceeds to step 1520, where the sensor configurations (originally set at step 1512) are modified based on a degree of difference between the estimated and defined detection zones. In an example scenario, the selection of which sensor objects are to be modified, which configuration settings on those sensor objects are to be adjusted, and the new values for these configuration settings can be based on the nature and degree of the difference between the estimated and defined detection zones. After the sensor configurations have been modified, the methodology returns to step 1514, and steps 1514-1518 repeat for another iteration. Steps 1514-1518 repeat until the comparison satisfies the similarity criterion at step 1518.

When the comparison satisfies the similarity criterion (YES at step 1518), the methodology proceeds to step 1522, where the sensor configuration settings used for the last simulation at step 1514 are output as sensor configuration data capable of configuring one or more safety sensors in accordance with the sensor configuration settings.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, instrumentation, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as Common Industrial Protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, near field communication (NFC), Bluetooth, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 16:
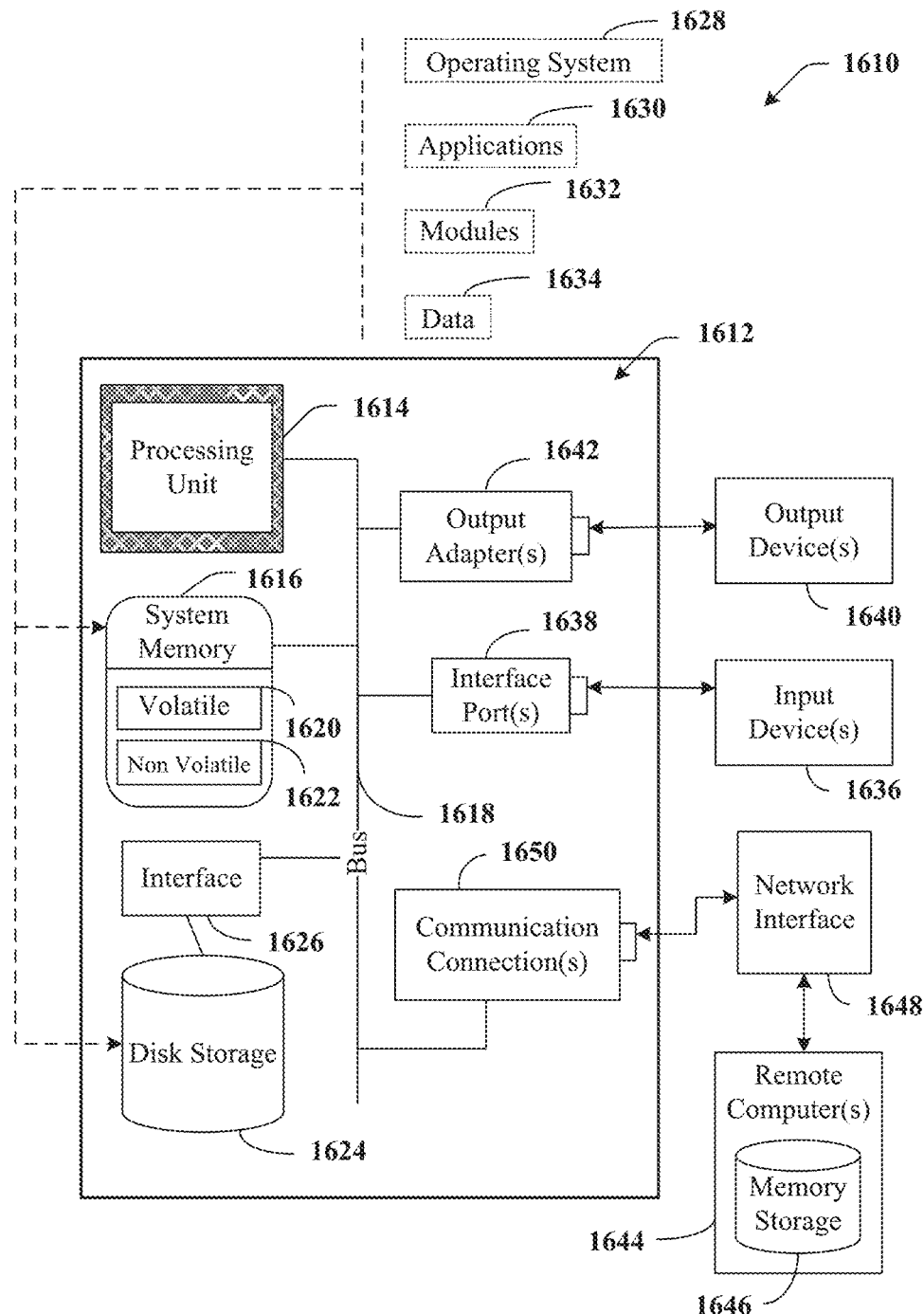
FIG. 16 is an example computing environment.
Figure 17:
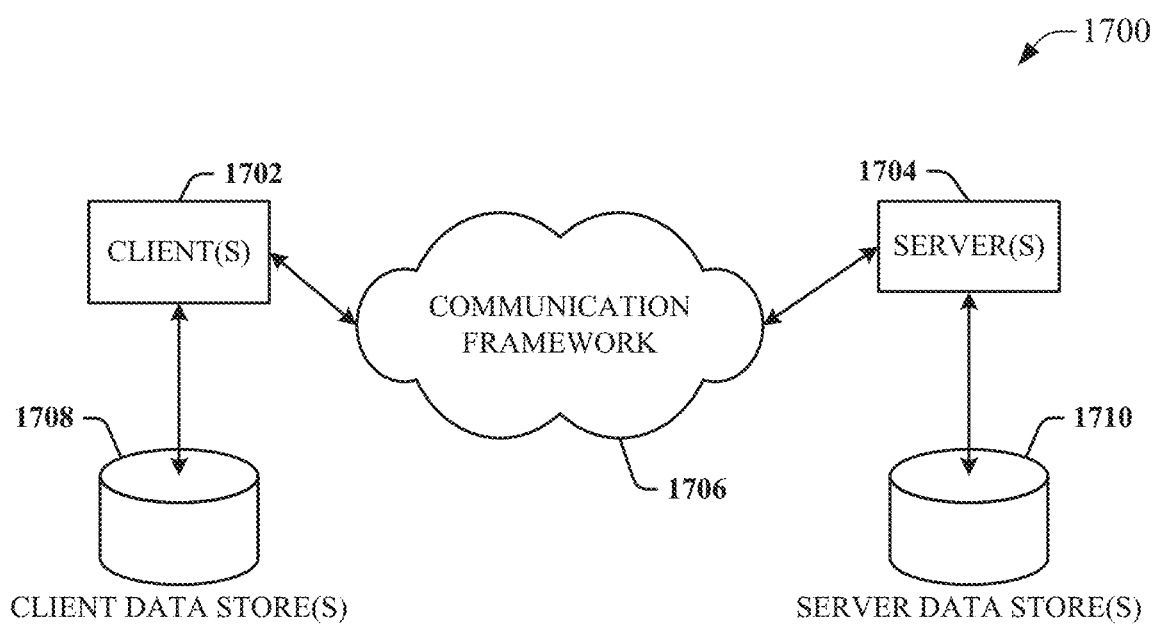
FIG. 17 is an example networking environment.

In order to provide a context for the various aspects of the disclosed subject matter, FIGS. 16 and 17 as well as the following discussion are intended to provide a brief, general description of a suitable environment in which the various aspects of the disclosed subject matter may be implemented.

With reference to FIG. 16, an example environment 1610 for implementing various aspects of the aforementioned subject matter includes a computer 1612. The computer 1612 includes a processing unit 1614, a system memory 1616, and a system bus 1618. The system bus 1618 couples system components including, but not limited to, the system memory 1616 to the processing unit 1614. The processing unit 1614 can be any of various available processors. Multi-core microprocessors and other multiprocessor architectures also can be employed as the processing unit 1614.

The system bus 1618 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1616 includes volatile memory 1620 and nonvolatile memory 1622. The basic input/output system (BIOS), containing the basic routines to transfer information between elements within the computer 1612, such as during start-up, is stored in nonvolatile memory 1622. By way of illustration, and not limitation, nonvolatile memory 1622 can include read only memory (ROM), programmable ROM (PROM), electrically programmable ROM (EPROM), electrically erasable PROM (EEPROM), or flash memory. Volatile memory 1620 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1612 also includes removable/non-removable, volatile/non-volatile computer storage media. FIG. 16 illustrates, for example a disk storage 1624. Disk storage 1624 includes, but is not limited to, devices like a magnetic disk drive, floppy disk drive, tape drive, Jaz drive, Zip drive, LS-100 drive, flash memory card, or memory stick. In addition, disk storage 1624 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1624 to the system bus 1618, a removable or non-removable interface is typically used such as interface 1626.

It is to be appreciated that FIG. 16 describes software that acts as an intermediary between users and the basic computer resources described in suitable operating environment 1610. Such software includes an operating system 1628. Operating system 1628, which can be stored on disk storage 1624, acts to control and allocate resources of the computer 1612. System applications 1630 take advantage of the management of resources by operating system 1628 through program modules 1632 and program data 1634 stored either in system memory 1616 or on disk storage 1624. It is to be appreciated that one or more embodiments of the subject disclosure can be implemented with various operating systems or combinations of operating systems.

A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port may be used to provide input to computer 1612, and to output information from computer 1612 to an output device 1640. Output adapters 1642 are provided to illustrate that there are some output devices 1640 like monitors, speakers, and printers, among other output devices 1640, which require special adapters. The output adapters 1642 include, by way of illustration and not limitation, video and sound cards that provide a means of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a personal computer, a server, a router, a network PC, a workstation, a microprocessor based appliance, a peer device or other common network node and the like, and typically includes many or all of the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL). Network interface 1648 can also encompass near field communication (NFC) or Bluetooth communication.

Communication connection(s) 1650 refers to the hardware/software employed to connect the network interface 1648 to the system bus 1618. While communication connection 1650 is shown for illustrative clarity inside computer 1612, it can also be external to computer 1612. The hardware/software necessary for connection to the network interface 1648 includes, for exemplary purposes only, internal and external technologies such as, modems including regular telephone grade modems, cable modems and DSL modems, ISDN adapters, and Ethernet cards.

FIG. 17 is a schematic block diagram of a sample computing environment 1700 with which the disclosed subject matter can interact. The sample computing environment 1700 includes one or more client(s) 1702. The client(s) 1702 can be hardware and/or software (e.g., threads, processes, computing devices). The sample computing environment 1700 also includes one or more server(s) 1704. The server(s)

1704 can also be hardware and/or software (e.g., threads, processes, computing devices). The servers 1704 can house threads to perform transformations by employing one or more embodiments as described herein, for example. One possible communication between a client 1702 and servers 1704 can be in the form of a data packet adapted to be transmitted between two or more computer processes. The sample computing environment 1700 includes a communication framework 1706 that can be employed to facilitate communications between the client(s) 1702 and the server(s) 1704. The client(s) 1702 are operably connected to one or more client data store(s) 3208 that can be employed to store information local to the client(s) 1702. Similarly, the server(s) 1704 are operably connected to one or more server data store(s) 1710 that can be employed to store information local to the servers 1704.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. An industrial safety zone configuration system, comprising:
a memory that stores executable components;
a processor, operatively coupled to the memory, that executes the executable components, the executable components comprising:
a user interface component configured to
render a three-dimensional graphical representation of an industrial automation system based on a digital twin representing the industrial automation system,
receive, via interaction with the graphical representation, first input that defines a three-dimensional detection zone within the graphical representation, and
receive, via interaction with the graphical representation, second input that adds one or more sensor objects to the graphical representation at specified locations and orientations to yield a modified digital twin, wherein the one or more sensor objects represent respective one or more safety sensors and have associated therewith respective sets of object properties representing configuration settings of the one or more safety sensors;
a safety zone simulation component configured to estimate, based on analysis of the modified digital twin, an estimated detection zone monitored by the one or more sensor objects;
a safety zone configuration component configured to, in response to determining that the estimated detection zone does not match the detection zone defined by the first input within a tolerance, set a value of at least one object property of the sets of object properties based on a comparison between the estimated detection zone and the detection zone; and
a system interface component configured to generate sensor configuration data based on values of the sets of object properties and to configure the one or more safety sensors using the sensor configuration data,
wherein
the safety zone simulation component is further configured to, for a sensor object of the one or more sensor objects, estimate a level of multipath interference experienced by a safety sensor represented by the sensor object based on analysis of the specified locations and orientations of the one or more sensor objects and physical obstructions modeled by the modified digital twin, and
the safety zone configuration component is further configured to, in response to determining that the level of multipath interference exceeds a defined threshold, estimate a realignment of the sensor object that reduces the level of multipath interference and generate a recommendation to apply the realignment to the sensor object.

2. The industrial safety zone configuration system of claim 1, wherein one of the sets of object properties corresponding to a sensor object, of the one or more sensor objects, comprises at least one of a field of view monitored by the sensor object, a safe distance monitored by the sensor object, a tolerance zone distance associated with the sensor object, a sensor object frame-rate, or a macropixel arrangement.

3. The industrial safety zone configuration system of claim 1, further comprising a digital twin import component configured to import the digital twin into the industrial safety zone configuration system, wherein the digital twin is imported as at least one of a digital model from a computer-aided design platform or a digitized model generated based on a digital scanning of the automation system.

4. The industrial safety zone configuration system of claim 1, wherein the safety zone simulation component and the safety zone configuration component are configured to
perform the analysis of the modified digital twin iteratively for a range of different sets of values of the respective sets of object properties corresponding to the one or more sensor objects, and
select, as the values of the sets of object properties used to generate the sensor configuration data, one of the different sets of values that yields an estimated detection zone that satisfies a similarity criterion relative to the detection zone defined by the first input.

5. The industrial safety zone configuration system of claim 1, wherein
the safety zone simulation component is further configured to determine, based on the analysis of the modified digital twin and the comparison between the estimated detection zone and the detection zone defined by the first input, a modification to an orientation of a sensor object, of the one or more sensor objects, that is estimated to bring the estimated detection zone into closer alignment with the detection zone defined by the first input, and
the user interface component is further configured to render a recommendation to realign a safety sensor corresponding to the sensor object in accordance with the modification to the orientation.

6. The industrial safety zone configuration system of claim 1, wherein
the user interface component is further configured to receive, via interaction with the graphical representation, third input that adds one or more fiducial objects to the graphical representation at specified fiducial marker locations,
the safety zone simulation component is further configured to determine, based on the specified locations and orientations of the one or more sensor objects and the specified fiducial marker locations of the one or more fiducial objects, an arrangement of the one or more fiducial objects within a field of view of a sensor object of the one or more sensor objects, and
the system interface component is configured to generate, as part of the sensor configuration data, configuration data that programs a safety device corresponding to the sensor object to recognize the arrangement of the one or more fiducial objects.

7. The industrial safety zone configuration system of claim 1, wherein the safety zone simulation component is configured to estimate the level of multipath interference further based in part on ray-tracing analysis performed on the modified digital twin.

8. The industrial safety zone configuration system of claim 1, wherein the user interface component is further configured to render the estimated detection zone and the detection zone defined by the first input as respective three-dimensional semitransparent overlays on the graphical representation.

9. The industrial safety zone configuration system of claim 1, wherein the industrial safety zone configuration system is a subsystem of an industrial controller programming application.

10. The industrial safety zone configuration system of claim 1, wherein
the detection zone is a dynamic detection zone having a shape or a location that varies according to defined states of the industrial automation system, and
the system interface component is configured to update the sensor configuration data to vary the shape or the location of the dynamic detection zone based on status data read from the industrial automation system.

11. A method for configuring safety sensors, comprising:
rendering, by a system comprising a processor, a three-dimensional graphical representation of an industrial automation system based on a digital twin representing the industrial automation system;
defining, by the system, a three-dimensional detection zone within the graphical representation in accordance with first input received via interaction with the graphical representation;
adding, by the system, one or more sensor objects representing respective one or more safety sensors to the graphical representation at specified locations and orientations in accordance with second input received via interaction with the graphical interface, wherein the one or more sensor objects have associated therewith respective sets of object properties representing configuration settings of the one or more safety sensors, and the adding yields a modified digital twin;
determining, by the system based on analysis of the modified digital twin, an estimated detection zone monitored by the one or more sensor objects;
in response to determining that the estimated detection zone does not satisfy a similarity criterion relative to the detection zone defined by the first input, modifying, by the system based on a comparison between the estimated detection zone and the detection zone defined by the first input, a value of at least one object property of the sets of object properties;
estimating, by the system based on an analysis of the specified locations and orientations of the one or more sensor objects and physical obstructions modeled by the modified digital twin, a level of multipath interference experienced by a safety sensor represented by a sensor object of the one or more sensor objects;
in response to determining that the level of multipath interference exceeds a defined threshold:
estimating, by the system, a realignment of the sensor object that reduces the level of multipath interference, and
generating, by the system, a recommendation to apply the realignment to the sensor object;
generating, by the system, sensor configuration data based on values of the sets of object properties; and
configuring, by the system, the one or more safety sensors using the sensor configuration data.

12. The method of claim 11, wherein the modifying comprises modifying, as the value of at least one object property, at least one of a field of view monitored by a sensor object of the one or more sensor objects, a safe distance monitored by the sensor object, a tolerance zone distance associated with the sensor object, a sensor frame-rate, or a macropixel arrangement.

13. The method of claim 11, further comprising importing, by the system, the digital twin from a computer-aided design platform.

14. The method of claim 11, further comprising
performing, by the system, the determining and the modifying iteratively for different sets of values of the respective sets of object properties; and
selecting, as the values of the sets of object properties used to perform the generating, one of the different sets of values that yields an estimated detection zone that satisfies a similarity criterion relative to the detection zone defined by the first input.

15. The method of claim 11, further comprising:
determining, by the system based on the analysis of the modified digital twin and the comparison between the estimated detection zone and the detection zone defined by the first input, a modification to an orientation of a sensor object, of the one or more sensor objects, that is estimated to bring the estimated detection zone into substantial alignment with the detection zone defined by the first input; and
rendering, by the system, a recommendation to realign a safety sensor corresponding to the sensor object in accordance with the modification to the orientation.

16. The method of claim 11, further comprising:
adding, by the system, one or more fiducial objects to the graphical representation at specified fiducial marker locations in accordance with third input received via interaction with the graphical representation;
determining, by the system based on the specified locations and orientations of the one or more sensor objects and the specified fiducial marker locations of the one or more fiducial objects, an orientation of the one or more fiducial objects within a field of view of a sensor object of the one or more sensor objects; and
generating, by the system as part of the sensor configuration data, configuration data that programs a safety sensor corresponding to the sensor object to recognize the orientation of the one or more fiducial objects.

17. A non-transitory computer-readable medium having stored thereon instructions that, in response to execution, cause a system comprising a processor to perform operations, the operations comprising:
rendering a three-dimensional graphical representation of an industrial automation system based on a digital twin representing the industrial automation system;
defining, based on first input received via interaction with the graphical representation, a three-dimensional detection zone within the graphical representation;
adding, based on second input received via interaction with the graphical representation, one or more sensor objects representing respective one or more safety sensors to the graphical representation at specified locations and orientations, wherein the one or more sensor objects have associated therewith respective sets of object properties representing configuration settings of the one or more safety sensors, and the adding yields a modified digital twin;
determining, based on analysis of the modified digital twin, an estimated detection zone monitored by the one or more sensor objects;
in response to determining that the estimated detection zone deviates from the detection zone defined by the first input in excess of a tolerance, modifying, based on a measured degree of similarity between the estimated detection zone and the detection zone defined by the first input, a value of at least one object property of the sets of object properties to yield modified configuration setting values;
estimating, based on the analysis of the specified locations and orientations of the one or more sensor objects and physical obstructions modeled by the modified digital twin, a level of multipath interference experienced by a safety sensor represented by a sensor object of the one or more sensor objects;
in response to determining that the level of multipath interference exceeds a defined threshold:
estimating a realignment of the sensor object that reduces the level of multipath interference, and
generating a recommendation to apply the realignment to the sensor object;
generating sensor configuration data based on values of the sets of object properties; and
configuring the one or more safety sensors using the sensor configuration data.

18. The non-transitory computer-readable medium of claim 17, wherein the modifying comprises modifying, as the value of at least one object property, at least one of a field of view monitored by a sensor object of the one or more sensor objects, a safe distance monitored by the sensor object, a tolerance zone distance associated with the sensor object, a frame rate, or a macropixel layout.

19. The method of claim 11, further comprising:
obtaining contextual data from one or more industrial devices of the industrial automation system, wherein the contextual data represents a state of the industrial automation system,
estimating, based on a simulation analysis performed on the modified digital twin based on values of the sets of sensor object properties and the contextual data, an estimated three-dimensional detection zone monitored by a safety sensor of the one or more safety sensors;
determining, based on a comparison between the estimated three-dimensional detection zone and a defined three-dimensional detection zone, a new value of at least one of the set of sensor object properties that optimizes a degree of similarity between the estimated three-dimensional detection zone and the defined three-dimensional detection zone;
setting the at least one of the set of sensor object properties according to the new value to yield a modified set of sensor object properties;
converting the modified set of sensor object properties into sensor configuration data that configures the safety sensor in accordance with the modified set of sensor object properties; and
configuring the safety sensor in accordance with the sensor configuration data.

20. The non-transitory computer-readable medium of claim 17, wherein the operations further comprise:
performing the determining and the modifying iteratively for different sets of values of the respective sets of object properties; and
selecting, as the values of the sets of object properties used to perform the generating, one of the different sets of values that yields an estimated detection zone that satisfies a similarity criterion relative to the detection zone defined by the first input.

21. The non-transitory computer-readable medium of claim 17, wherein the operations further comprise importing the digital twin from a computer-aided design platform.

* * * * *